(12) United States Patent
Ouderkirk et al.

(10) Patent No.: US 12,421,939 B1
(45) Date of Patent: Sep. 23, 2025

(54) ACTUATOR FOR GENERATING COMPOUND CURVATURE

(71) Applicant: META PLATFORMS TECHNOLOGIES, LLC, Menlo Park, CA (US)

(72) Inventors: Andrew John Ouderkirk, Kirkland, WA (US); Spencer Allan Wells, Seattle, WA (US); Renate Eva Klementine Landig, Seattle, WA (US); Kenneth Alexander Diest, Kirkland, WA (US); Christopher Stipe, Woodinville, CA (US); Robin Sharma, Woodinville, CA (US); Jo Anne Etter, Kirkland, WA (US); Nagi Hosni Elabbasi, Southborough, MA (US); James Howard Thomas Ransley, Medford, MA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 1062 days.

(21) Appl. No.: 17/341,473

(22) Filed: Jun. 8, 2021

Related U.S. Application Data

(60) Provisional application No. 63/048,726, filed on Jul. 7, 2020.

(51) Int. Cl.
| | | |
|---|---|---|
| *H01L 41/047* | (2006.01) | |
| *F03G 7/00* | (2006.01) | |
| *H10N 30/20* | (2023.01) | |
| *H10N 30/857* | (2023.01) | |
| *H10N 30/87* | (2023.01) | |

(52) U.S. Cl.
CPC ............ *F03G 7/005* (2013.01); *H10N 30/204* (2023.02); *H10N 30/857* (2023.02); *H10N 30/87* (2023.02)

(58) Field of Classification Search
CPC ..... H10N 30/204; H10N 30/857; H01N 30/87
See application file for complete search history.

(56) References Cited

U.S. PATENT DOCUMENTS

| | | | | |
|---|---|---|---|---|
| 2003/0006669 | A1* | 1/2003 | Pei | H02N 11/006 310/309 |
| 2012/0186859 | A1* | 7/2012 | Yamashita | H05K 3/28 174/254 |
| 2016/0126450 | A1* | 5/2016 | Rodegheri | H10N 30/03 29/25.35 |
| 2020/0177103 | A1* | 6/2020 | Lindsay | H10N 30/01 |
| 2020/0186056 | A1* | 6/2020 | Menguc | H10N 30/857 |
| 2020/0301525 | A1* | 9/2020 | Tonar | H10N 30/857 |

\* cited by examiner

*Primary Examiner* — Bryan P Gordon
(74) *Attorney, Agent, or Firm* — Greenberg Traurig, LLP

(57) ABSTRACT

An actuator includes a primary electrode, a secondary electrode overlapping at least a portion of the primary electrode, and an electroactive layer disposed between and abutting the primary electrode and the secondary electrode, where a mechanical deformation of the electroactive layer is locally controllable over an area of the actuator. The mechanical deformation of the electroactive layer may be configured to generate compound curvature, e.g., in an optical element co-integrated with the actuator, without buckling the optical element.

16 Claims, 16 Drawing Sheets

ACTUATOR FOR GENERATING COMPOUND CURVATURE

CROSS-REFERENCE TO RELATED APPLICATION

This application claims the benefit of priority under 35 U.S.C. § 119 (e) of U.S. Provisional Application No. 63/048,726, filed Jul. 7, 2020, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
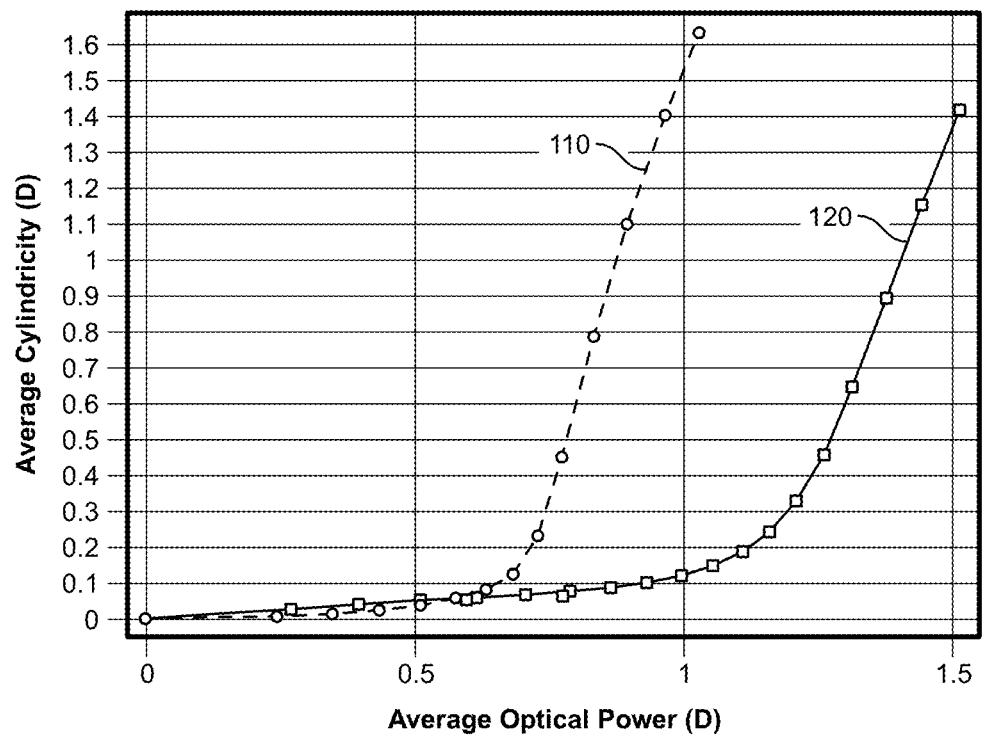
FIG. 1 is a plot of cylindricity versus optical power for a lens integrated with example electroactive actuators according to various embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Polymer and ceramic materials may be incorporated into a variety of different optic and electro-optic device architectures, including active and passive optics and electroactive devices. Electroactive materials, including electroactive polymer (EAP) and electroactive ceramic compositions, for example, may change their shape under the influence of an electric field. Electroactive materials have been investigated for use in various technologies, including actuation, sensing, and/or energy harvesting. Lightweight and conformable, thin film electroactive materials may be incorporated into wearable devices such as haptic devices and are attractive candidates for emerging technologies including virtual reality/augmented reality devices where a comfortable, adjustable form factor is desired.

Virtual reality and augmented reality eyewear devices or headsets, for instance, may enable users to experience events, such as interactions with people in a computer-generated simulation of a three-dimensional world or viewing data superimposed on a real-world view. Virtual reality/augmented reality eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of thin film electroactive materials, including the Poisson's ratio to generate a lateral deformation (e.g., lateral expansion or contraction) as a response to compression between conductive electrodes. Example virtual reality/augmented reality assemblies containing electroactive layers may include deformable optics, such as mirrors, lenses, or adaptive optics. Deformation of the electroactive material may be used to actuate optical elements in an optical assembly.

Although very thin layers of many electroactive materials can be highly transparent, the achievable optical power derivable from actuation of an electroactive material used to change the shape of a lens, such as a liquid lens, may be limited by the generation of excessive cylindrical distortion and the attendant buckling of the lens. Thus, notwithstanding recent developments, it would be advantageous to provide electroactive actuators having improved actuation characteristics, including a controllable and sufficient deformation response in an optically transparent package.

The present disclosure is generally directed to actuator systems, and more specifically to electroactive actuators that are adapted to be incorporated into a liquid lens and that are configured to generate compound curvature in the lens without creating significant cylindrical distortion. With such actuators, a liquid lens may be reversibly deformable and may be modified to include an aspherical shape. Furthermore, the electroactive actuators disclosed herein may be used to produce a curvature profile in an associated liquid lens having both spherical and cylindrical components without buckling the lens.

Example actuators may include unimorph and bimorph architectures. A "unimorph" actuator may, in some examples, include a layer of electroactive material overlying a passive, elastic layer. The elastic layer may include an organic material such as a polymer or an inorganic material such as a metal. In response to a voltage applied across the thickness of the electroactive layer, longitudinal and transverse strains may develop. In turn, the elastic layer may oppose the transverse strain(s), which may produce a bending deformation. In further examples, a "bimorph" actuator may be configured as a double layer element having a pair of electroactive layers. During operation, a voltage may be applied to each electroactive layer such that one layer expands while the other layer contracts. The opposing strain states may cause the bimorph element to bend.

Electroactive actuators may be incorporated into a liquid lens to form an active lens. In some embodiments, unimorph and bimorph actuators may be used to produce a simple curve, where the curvature is predominantly along one direction, and negligible in a transverse direction. Simple curvature may also be referred to as "cylindrical curvature," which may be characterized by zero or substantially zero Gaussian curvature.

In further embodiments, unimorph and bimorph actuators can be used to form transparent actuators that can form compound curves. As used herein, an article or element exhibiting "compound curvature" may, in certain examples, include a curve having two or more circular arcs of successively shorter or longer radii, joined tangentially, without a reversal of curvature. Compound curvature may also be referred to as double curvature or spherical curvature and may be characterized by a high Gaussian curvature. Compound curvature that includes two equal curvatures along mutually perpendicular directions leads to "spherical curvature."

During actuation, the formation of compound curvature may create a combination of radial and hoop stresses. Whereas radial stresses may accompany the desired deformation of the lens, compressive hoop stresses may create poorly controlled cylindricity, which may lead to lens buckling and mechanical failure. Buckling may be exacerbated for high aspect ratio structures, such as where the lateral dimensions of the lens are greater than approximately 10 times its thickness, e.g., lateral lens dimensions greater than approximately 100 times or greater than approximately 1000 times its thickness.

In an active lens architecture, Applicants have shown that by spatially varying the mechanical forces generated in one or more of the actuator layers, the tendency for the associated lens to buckle may be decreased, which may allow higher degrees of curvature and hence optical power to be achieved without unacceptable mechanical deformation of the lens. That is, disclosed is an actuator capable of creating compound curvature, where the mechanical response of the actuator is controllably varied over an area of the lens. In example embodiments, an electroactive actuator may be configured to create a spatially variable deformation. The electroactive actuator may be used to locally tailor the curvature of a liquid lens and thereby induce a wide range of diopter curvature without causing mechanical buckling. In certain embodiments, the electroactive actuator may create compound curvature, such as aspherical contours, and may be used to form a lens profile that includes spherical and cylindrical components.

In accordance with some embodiments, a spatially variable deformation response may be generated using segmented (patterned) electrodes, where the magnitude of an actuation bias may be locally applied to the electroactive layer. As used herein, a feature, element, or step that is "local," "localized," applied "locally," etc., may in some examples refer to a condition, state, characteristic, etc. that is restricted or restrained to one region, area, or volume. According to some embodiments, patterned electrodes (e.g., one or both of a primary electrode and a secondary electrode) may be used to locally actuate one or more regions within an intervening electroactive layer, e.g., to the exclusion of, or to a different degree than, adjacent regions within the same electroactive layer.

In some embodiments, such patterned electrodes may be independently biased. Patterned electrodes may be formed by selective deposition of an electrode layer or by blanket deposition of an electrode layer followed by patterning and etching, e.g., using photolithographic techniques, as known to those skilled in the art. A patterned electrode may include a wire grid, or a wire grid may be incorporated into an optical element as a separate layer adjacent to an electrode layer. Discretely patterned electrodes may be individually addressable with distinct voltages, either simultaneously or sequentially.

In further embodiments, poling of the electroactive material may include the localized application of one or more of temperature and electric field for a specified period of time to create an electroactive layer having a spatially variable response to a uniformly applied actuation bias. For instance, as disclosed in further detail herein, the piezoelectric response of certain electroactive materials may be modified spatially by one or a combination of poling methods, which serve to align electric dipoles along a common direction within the material, and which may include (a) applying a controlled array of voltages while heating the electroactive material above its Curie temperature, and then cooling the electroactive material while maintaining the applied voltages, (b) selectively heating the electroactive material above its Curie temperature and cooling selected regions of the electroactive material under a controlled poling voltage, and (c) uniformly poling the electroactive material and then selectively heating and/or cooling regions to locally affect the degree of poling. In some embodiments, a constant voltage may be applied during the act of poling. In some embodiments, the poling voltage may be varied temporally, which may include a change in polarity. Cooling the electroactive material may include cooling to a temperature of about room temperature, e.g., approximately 23° C.

As used herein, "electroactive" materials, including piezoelectric and electrostrictive materials may, in some examples, refer to materials that exhibit a change in size or shape when stimulated by an external electric field. In the presence of an electric field (E-field), an electroactive material may deform (e.g., compress, elongate, bend, etc.) according to the magnitude and direction of the applied field.

By way of example, in accordance with various embodiments, when exposed to an external electric field, an accumulated displacement of ions within an electroactive ceramic may produce an overall strain (elongation) in the direction of the field. That is, positive ions may be displaced in the direction of the field and negative ions displaced in the opposite direction. In turn, the thickness of the electroactive ceramic may be decreased in one or more orthogonal directions, as characterized by the Poisson's ratio.

Generation of such an electric field may be accomplished, for example, by placing the electroactive material between two electrodes, i.e., a primary electrode and a secondary electrode, each of which is at a different potential. As the potential difference (i.e., voltage difference) between the electrodes is increased (e.g., from zero potential) the amount of deformation may also increase, principally along electric field lines. This deformation may achieve saturation when a certain electrostatic field strength has been reached. With no electric field, the electroactive material may be in its relaxed state undergoing no induced deformation, or stated equivalently, no induced strain, either internal or external.

In some instances, the physical origin of the deformation of electroactive materials in the presence of an electrostatic field (E-field), being the force created between opposite electric charges, is that of the Maxwell stress, which is expressed mathematically with the Maxwell stress tensor. The level of strain or deformation induced by a given E-field is dependent on the square of the E-field strength, as well as the dielectric constant and elastic compliance of the electroactive material. Compliance in this case is the change of strain with respect to stress or, analogously, in more practical terms, the change in displacement with respect to force. In some embodiments, an electroactive layer may be pre-strained (or pre-stressed) to modify the stiffness of the optical element (e.g., a liquid lens) and hence its actuation characteristics.

The optical element may be deformable from an initial state to a deformed state when a first voltage form is applied between the primary electrode(s) and the secondary electrode(s) and may further be deformable to a second deformed state when a second voltage form is applied between the primary electrode(s) and the secondary electrode(s). In some embodiments, the deformation response may include a mechanical response to the electrical input that varies over the spatial extent of the device, with the electrical input being applied between opposing electrodes. The mechanical response may be termed an actuation, and example devices or optical elements may be, or include, actuators.

In certain embodiments, an actuator may be located within the transparent aperture of an optical device such as a liquid lens, although the present disclosure is not particularly limited and may be applied in a broader context. By way of example, the optical element may be incorporated into an active grating, tunable lens, accommodative optical element, adaptive optics, etc. According to various embodiments, the optical element may be optically transparent.

As used herein, a material or element that is "transparent" or "optically transparent" may, for example, have a transmissivity within the visible light spectrum of at least approximately 70%, e.g., approximately 70, 80, 90, 95, 97, 98, 99, or 99.5%, including ranges between any of the foregoing values, and less than approximately 10% bulk haze, e.g., approximately 0.5, 1, 2, 4, 6, or 8% bulk haze, including ranges between any of the foregoing values. In accordance with some embodiments, a "fully transparent" material or element may have a transmissivity (i.e., optical transmittance) within the visible light spectrum of at least approximately 90%, e.g., approximately 90, 95, 97, 98, 99, or 99.5%, including ranges between any of the foregoing values, less than approximately 10% bulk haze, e.g., approximately 0.5, 1, 2, 4, 6, or 8% bulk haze, including ranges between any of the foregoing values, less than approximately 30% reflectivity, e.g., approximately 1, 2, 5, 10, 15, 20, or 25% reflectivity, including ranges between any of the foregoing values, and at least 70% optical clarity, e.g., approximately 70, 80, 90, 95, 97, 98, 99, or 99.5% optical clarity, including ranges between any of the foregoing values. Transparent and fully transparent materials will typically exhibit very low optical absorption and minimal optical scattering.

As used herein, the terms "haze" and "clarity" may refer to an optical phenomenon associated with the transmission of light through a material, and may be attributed, for example, to the refraction of light within the material, e.g., due to secondary phases or porosity and/or the reflection of light from one or more surfaces of the material. As will be appreciated by those skilled in the art, haze may be associated with an amount of light that is subject to wide angle scattering (i.e., at an angle greater than 2.5° from normal incidence) and a corresponding loss of transmissive contrast, whereas clarity may relate to an amount of light that is subject to narrow angle scattering (i.e., at an angle less than 2.5° from normal incidence) and an attendant loss of optical sharpness or "see through quality."

According to various embodiments, the electroactive layer(s) may include a transparent polymer or ceramic material and the electrodes may each include one or more layers of any suitable conductive material, such as transparent conductive oxides, e.g., TCOs such as indium tin oxide (ITO), indium gallium zinc oxide (IGZO), graphene, etc.

Example electroactive polymers include polydimethylsiloxane (PDMS), acrylates, polyvinylidene fluoride (PVDF) or its copolymers such as poly(vinylidenefluoride-co-trifluoroethylene) (PVDF-TrFE)). Further PVDF-based polymers include poly(vinylidene fluoride-trifluoroethylene-chlorofluoroethylene (P(VDF-TrFE-CFE)) and poly(vinylidenefluoride-trifluoroethylene-chlorotrifluoroethylene (P(VDF-TrFE-CTFE)).

For piezoelectric polymers like PVDF homopolymer, the piezoelectric response may be tuned by altering the crystalline content and/or the crystalline orientation within the polymer matrix, e.g., by uniaxial or biaxial stretching, followed by poling. The origin of piezoelectricity in PVDF homopolymer is believed to be the β-phase crystallite polymorph, which is the most electrically active and polar of the PVDF phases. Alignment of the β-phase structure may be used to achieve the desired piezoelectric effect. Poling may be performed to align the β-phase and enhance the piezoelectric response. Other piezoelectric polymers, such as PVDF-TrFE and PVDF-TrFE-CFE may be suitably oriented upon formation and the piezoelectric response of such polymers may be improved by poling with or without stretching.

Additional examples of materials forming electroactive polymers include, without limitation, styrenes, polyesters, polyamides, polycarbonates, epoxies, halogenated polymers, silicone polymers, and/or any other suitable polymer or polymer precursor materials including ethyl acetate, butyl acrylate, octyl acrylate, ethylethoxy ethyl acrylate, 2-chloroethyl vinyl ether, chloromethyl acrylate, methacrylic acid, dimethacrylate oligomers, isocyanates, allyl glycidyl ether, N-methylol acrylamide, or mixtures thereof. Example acrylates may be free-radical initiated. Such materials may have any suitable dielectric constant or relative permittivity, such as, for example, a dielectric constant ranging from approximately 2 to approximately 30.

In some embodiments, an electroactive polymer may include an elastomer. As used herein, an "elastomer" may, in some examples, refer to a material having viscoelasticity (i.e., both viscosity and elasticity), relatively weak intermolecular forces, and generally low elastic modulus (a measure of the stiffness of a solid material) and a high strain-to-failure compared with other materials. In some embodiments, an electroactive polymer may include an elastomer material that has an effective Poisson's ratio of less than approximately 0.35 (e.g., less than approximately 0.3, less than approximately 0.25, less than approximately 0.2, less than approximately 0.15, less than approximately 0.1, or less than approximately 0.05). In at least one example, the elastomer material may have an effective density that is less than approximately 90% (e.g., less than approximately 80%, less than approximately 70%, less than approximately 60%, less than approximately 50%, less than approximately 40%) of the elastomer when densified (e.g., when the elastomer is compressed, for example, by electrodes to make the elastomer more dense).

An electroactive ceramic material may include a transparent polycrystalline ceramic or a transparent single crystal material. In some embodiments, a polycrystalline electroactive ceramic may have a relative density of at least approximately 99%, e.g., 99%, 99.5%, 99.9%, 99.95%, 99.99%, 99.995%, or 99.999%, including ranges between any of the foregoing values, and an average grain size of at least approximately 300 nm, e.g., 300 nm, 400 nm, 500 nm, 1000 nm, or 2000 nm, including ranges between any of the foregoing values.

Example electroactive ceramics may include one or more ferroelectric ceramics, as well as solid solutions or mixtures thereof. Typically, ferroelectric materials are characterized by high dielectric permittivity values, where the temperature of the maximum real dielectric permittivity corresponds to the ferroelectric-paraelectric phase transition temperature. The so-called relaxor ferroelectrics, on the other hand, may exhibit a more elaborate dielectric response. Relaxor ferroelectrics may be characterized by (i) wide peaks in the temperature dependence of the dielectric permittivity, (ii) a frequency-dependent dielectric permittivity, where the temperature of the respective maxima for the real and imaginary components of the permittivity appear at different values, and (iii) a temperature of the maximum in the real dielectric permittivity that may be independent of the ferroelectric-paraelectric phase transition temperature.

The origin of relaxor behavior in ferroelectrics may be attributed to a positional disorder of cations on A or B sites of the perovskite blocks that delay the evolution of long-range polar ordering. Commonly, the localized disorder in relaxor compounds may be attributed to their complex and disordered chemical structure, where multiple atoms may substitute on one atomic site. In the example of lead magnesium niobium oxide, for instance, both magnesium and niobium can occupy the same position in the crystal lattice. As a further example, lead zirconate titanate (PZT) is a typical ferroelectric perovskite showing a conventional FE-PE phase transition. However, the partial substitution of different elements, such as lanthanum or samarium, may increase disorder within the material and induce relaxor characteristics. Moreover, in accordance with some embodiments, for some lanthanum or samarium concentrations, the distortion of the PZT crystalline lattice due to ion displacement may promote the formation of polar nanoregions (PNRs), which may inhibit the formation of long-range ferroelectric domains. For some compositions, polar nanoregions that are present under zero applied field may beneficially persist through an applied field of up to approximately 2 V/micrometer, e.g., at least 0.5, 1, 1.5, or 2 V/micrometer, including ranges between any of the foregoing values, whereas other compositions having polar nanoregions under zero applied field (e.g., PLZT) may undergo a field-induced relaxor-to-ferroelectric phase transformation, which may adversely impact one or more optical properties.

In accordance with various embodiments, example electroactive ceramics may include one or more compositions from the relaxor-PT-based family, which includes binary compositions such as $Pb(Mg_{1/3}Nb_{2/3})O_3$—$PbTiO_3$ (PMN-PT), $Pb(Zn_{1/3}Nb_{2/3})O_3$—$PbTiO_3$ (PZN-PT), ternary crystals such as $Pb(Zn_{1/3}Nb_{2/3})O_3$—$PbTiO_3$—$BaTiO_3$ (PZN-PT-BT), and the like. Generally, lead-based relaxor materials may be represented by the formula $Pb(B_1B_2)O_3$, where $B_1$ may include $Mg^{2+}$, $Zn^{2+}$, $Ni^{2+}$, $Sc^{3+}$, $Fe^{3+}$, $Yb^{3+}$, $In^{3+}$, etc. and $B_2$ may include $Nb^{5+}$, $Ta^{5+}$, $W^{6+}$, etc., although other relaxor compositions are contemplated.

Further electroactive ceramic compositions include barium titanate, barium titanium zirconium oxide, barium titanium tin oxide, barium strontium titanium oxide, barium zirconium oxide, lead magnesium titanium oxide, lead magnesium niobium oxide, lead magnesium niobium titanium zirconium oxide, lead scandium niobium oxide, lead scandium tantalum oxide, lead iron niobium oxide, lead iron tantalum oxide, lead iron tungsten oxide, lead indium niobium oxide, lead indium tantalum oxide, lead lanthanum zirconium titanium oxide, lead ytterbium niobium oxide, lead ytterbium tantalum oxide, lead zinc tantalum oxide, lead zinc niobium oxide, lead zinc niobium titanium oxide, lead zinc niobium titanium zirconium oxide, bismuth magnesium niobium oxide, bismuth magnesium tantalum oxide, bismuth zinc niobium oxide, bismuth zinc tantalum oxide, potassium sodium niobate, and combinations thereof.

According to various embodiments, any of the foregoing ceramic compositions may be further combined with one or more of strontium titanium oxide, calcium titanium oxide, lead titanium oxide, lead zirconium titanium oxide, barium titanium oxide, bismuth iron oxide, sodium bismuth titanium oxide, bismuth scandium oxide, bismuth titanium oxide, lithium tantalum oxide, sodium potassium niobium oxide, and lithium niobium oxide. Moreover, electroactive ceramic compositions may further include one or more dopants such as niobium, potassium, sodium, calcium, gallium, indium, bismuth, aluminum, strontium, barium, samarium, dysprosium, magnesium, iron, tantalum, yttrium, lanthanum, europium, neodymium, scandium and erbium.

Electroactive materials, including polycrystalline ceramics, may be formed by powder processing. Densely-packed networks of high purity, ultrafine polycrystalline particles can be highly transparent and may be more mechanically robust in thin layers than their single crystal counterparts. For instance, optical grade PLZT having >99.9% purity may be formed using sub-micron (e.g., <2 μm) particles. Substitution via doping of $Pb^{2+}$ at A and B-site vacancies with $La^{2+}$ and/or $Ba^{2+}$ may be used to increase the transparency of perovskite ceramics such as textured or un-textured PLZT, PZN-PT, and PMN-PT.

As known to those skilled in the art, ultrafine particle precursors can be fabricated via wet chemical methods, such as chemical co-precipitation, sol-gel and gel combustion. Grinding, ball milling, planetary milling, etc. may be used to modify the size and/or shape of ceramic powders. Green bodies may be formed using tape casting, slip casting, or gel casting. High pressure and high temperature sintering via techniques such as conventional sintering, cold sintering, hot pressing, high pressure (HP) and hot isostatic pressure, spark plasma sintering, flash sintering, two-stage sintering, and microwave sintering, for example, may be used to improve the ceramic particle packing density. More than one of the previous techniques may be used in conjunction as understood by one skilled in the art, for example, to achieve initial densification by one process and final densification by a secondary process while controlling grain growth during sintering. Sintered ceramics may be cut to a desired final shape and thinning via lapping and/or polishing may be used to decrease surface roughness to achieve thin, highly optically transparent layers that are suitable for high displacement actuation.

In addition to the foregoing, single crystal ceramics may be formed, for example, using hydrothermal processing or by a Czochralski method to produce an oriented ingot, which may be cut along a specified crystal plane to produce wafers having a desired crystalline orientation. Further methods for forming single crystals include float zone, Bridgman, Stockbarger, chemical vapor deposition, physical vapor transport, solvothermal techniques, etc. A wafer may be thinned, e.g., via lapping or grinding, and/or polished, and transparent electrodes (e.g., a primary electrode and a secondary electrode) may be formed directly on the wafer, using chemical vapor deposition or a physical vapor deposition process such as sputtering or evaporation, for example. According to some embodiments, an electroactive ceramic layer may have an RMS surface roughness of less than approximately 50 nm, e.g., less than 50, 40, 30, 20, 10, or 5 nm, including ranges between any of the foregoing values. The electroactive ceramic may be poled to achieve a desired dipole alignment.

In certain embodiments, electroactive ceramics may be substantially free of secondary phases, i.e., may contain less than approximately 1% by volume of any secondary phase, including porosity, e.g., less than 1%, less than 0.5%, less than 0.2%, less than 0.1%, less than 0.05%, less than 0.02%, less than 0.01%, less than 0.005%, less than 0.002%, or less than 0.001% by volume, including ranges between any of the foregoing values. In some embodiments, the disclosed electroactive ceramics may be birefringent, which may be attributable to the material having plural distinct domains (e.g., polar nanoregions) or regions of varying polarization having different refractive indices.

According to various embodiments, a relaxor ceramic may include discrete (localized) regions of polar, i.e., non-cubic, material in a matrix having cubic symmetry. According to some embodiments, the polar nanoregions may have at least one dimension (length, width, or depth) of less than approximately 100 nm, e.g., less than 100 nm, less than 50 nm, less than 40 nm, less than 30 nm, less than 20 nm, less than 10 nm, or less than 5 nm, including ranges between any of the foregoing values. Electroactive (relaxor) ceramics may, according to some embodiments, be characterized by cubic or pseudocubic symmetry.

In some embodiments, optical elements may include paired electrodes, which allow the creation of the electrostatic field that forces displacement of the electroactive layer. In some embodiments, an "electrode," as used herein, may refer to an electrically conductive material, which may be in the form of a thin film, layer, or mesh. Electrodes may include relatively thin, electrically conductive metals or metal alloys and may be of a non-compliant or compliant nature.

An electrode may include one or more electrically conductive materials, such as a metal, a semiconductor (e.g., a doped semiconductor), carbon nanotubes, graphene, oxidized graphene, fluorinated graphene, hydrogenated graphene, other graphene derivatives, carbon black, transparent conductive oxides (TCOs, e.g., indium tin oxide (ITO), zinc oxide (ZnO), etc.), conducting polymers (e.g., PEDOT), or other electrically conducting materials. In some embodiments, the electrodes may include a metal such as aluminum, gold, silver, platinum, palladium, nickel, tantalum, tin, copper, indium, gallium, zinc, alloys thereof, and the like. Further example transparent conductive oxides include, without limitation, aluminum-doped zinc oxide, fluorine-doped tin oxide, indium-doped cadmium oxide, indium zinc oxide, indium zinc tin oxide, indium gallium tin oxide, indium gallium zinc oxide, indium gallium zinc tin oxide, strontium vanadate, strontium niobate, strontium molybdate, and calcium molybdate.

Example electrodes may have a sheet resistance of less than approximately 5000 ohms/square. In some embodiments, the electrode or electrode layer may be self-healing, such that damage from local shorting of a circuit can be isolated. Suitable self-healing electrodes may include thin films of materials that deform or oxidize irreversibly upon Joule heating, such as, for example, aluminum.

In some embodiments, a primary electrode may overlap (e.g., overlap in a parallel direction) at least a portion of a respective secondary electrode. The primary and secondary electrodes may be generally parallel and spaced apart and separated by a layer of electroactive material. A tertiary electrode may overlap at least a portion of either the primary or secondary electrode.

An optical element may include a first electroactive layer, which may be disposed between a first pair of electrodes (e.g., the primary electrode and the secondary electrode). The optical element may include a second electroactive layer, which may be disposed between a second pair of electrodes. In some embodiments, there may be an electrode that is common to both the first pair of electrodes and the second pair of electrodes.

In some embodiments, one or more electrodes may be optionally electrically interconnected, e.g., through a contact or schoopage layer, to a common electrode. In some embodiments, an optical element may have a first common electrode, connected to a first plurality of electrodes, and a second common electrode, connected to a second plurality of electrodes. In some embodiments, electrodes (e.g., one of a first plurality of electrodes and one of a second plurality of electrodes) may be electrically isolated from each other using an insulator, such as a dielectric layer. An insulator may include a material without appreciable electrical conductivity, and may include a dielectric material, such as, for example, an acrylate or silicone polymer.

In some applications, a transparent electroactive actuator used in connection with the principles disclosed herein may include a primary electrode, a secondary electrode, and an electroactive layer disposed between the primary electrode and the secondary electrode. In some embodiments, there may be one or more additional electrodes, and a common electrode may be electrically coupled to one or more of the additional electrodes. For example, a pair of actuators may be disposed in a stacked configuration, with a first common electrode coupled to a first plurality of electrodes, and a second common electrode electrically connected to a second plurality of electrodes. In some embodiments, a common electrode may be electrically coupled (e.g., electrically contacted at an interface having a low contact resistance) to one or more other electrode(s), e.g., a secondary electrode and a tertiary electrode located on either side of a primary electrode.

In some embodiments, electrodes may be flexible and/or resilient and may stretch, for example elastically, when an optical element undergoes deformation. In this regard, electrodes may include a metal such as aluminum, graphene, carbon nanotubes, etc. In other embodiments, relatively rigid electrodes (e.g., electrodes including one or more transparent conducting oxides (TCOs) such as indium tin oxide (ITO) or indium gallium zinc oxide (IGZO)) may be used.

In some embodiments, the electrodes (e.g., the primary electrode and the secondary electrode) may have a thickness of approximately 0.35 nm to approximately 1000 nm, e.g., approximately 0.35, 0.5, 1, 2, 5, 10, 20, 50, 100, 200, 500, or 1000 nm, including ranges between any of the foregoing values, with an example thickness of approximately 10 nm to approximately 50 nm. In some embodiments, a common electrode may have a sloped shape, or may be a more complex shape (e.g., patterned or freeform). In some embodiments, a common electrode may be shaped to allow compression and expansion of an optical element or device during operation.

The electrodes in certain embodiments may have an optical transmissivity of at least approximately 50%, e.g., approximately 50%, approximately 60%, approximately 70%, approximately 80%, approximately 90%, approximately 95%, approximately 97%, approximately 98%, approximately 99%, or approximately 99.5%, including ranges between any of the foregoing values.

In some embodiments, the electrodes described herein (e.g., the primary electrode, the secondary electrode, or any other electrode including any common electrode) may be fabricated using any suitable process. For example, the electrodes may be fabricated using physical vapor deposition (PVD), chemical vapor deposition (CVD), atomic layer deposition (ALD), evaporation, spray-coating, spin-coating, dip-coating, screen printing, Gravure printing, ink jet printing, aerosol jet printing, doctor blading, and the like. In further aspects, the electrodes may be manufactured using a thermal evaporator, a sputtering system, stamping, etc.

In some embodiments, a layer of electroactive material may be deposited directly on to an electrode. In some embodiments, an electrode may be deposited directly on to the electroactive material. In some embodiments, electrodes may be prefabricated and attached to an electroactive material. For instance, a prefabricated electrode may be bonded to an electroactive layer by thermocompression or metallic bonding, or by using an adhesive layer such as a pressure sensitive adhesive. Example pressure sensitive adhesives include various acrylate compounds. In further embodiments, an electrode may be deposited on a substrate, for example a glass substrate or flexible polymer film. In some embodiments, the electroactive material layer may directly abut an electrode. In some embodiments, there may be an insulating layer, such as a dielectric layer, between a layer of electroactive material and an electrode.

For example optical elements, in order to mediate reflective losses and inhibit the creation of optical artifacts such as ghost images, example multilayer structures may further include an antireflective coating (ARC). According to various embodiments, an antireflective coating may be disposed over either or both electrodes (e.g., a primary antireflective coating may be formed over at least a portion of a surface of the primary electrode opposite to the electroactive layer and/or a secondary antireflective coating may be formed over at least a portion of a surface of the secondary electrode opposite to the electroactive layer).

The antireflective coating(s) may be optically transparent and accordingly exhibit less than 10% bulk haze and a transmissivity within the visible spectrum of at least approximately 50%. For instance, an antireflective coating may be configured to maintain at least 70% transmissivity over 106 actuation cycles and an induced engineering strain of up to approximately 1%. In some embodiments, the antireflective coating(s) may exhibit a reflectivity within the visible spectrum of less than approximately 30%.

Example antireflective coatings may include one or more dielectric layers, which may include a stoichiometric or non-stoichiometric oxide, fluoride, oxyfluoride, nitride, oxynitride, sulfide, including but not limited to $SiO_2$, $TiO_2$, $Al_2O_3$, $Y_2O_3$, $HfO_2$, $ZrO_2$, $Ta_2O_5$, $Cr_2O_3$, $AlF_3$, $MgF_2$, $NdF_3$, $LaF_3$, $YF_3$, $CeF_3$, $YbF_3$, $Si_3N_4$, $ZnS$, or $ZnSe$.

In some embodiments, an antireflective coating may be configured as a multilayer stack. A multilayer stack may include one or more dielectric layers, and in certain embodiments an antireflective coating may include a transparent electrode. That is, a primary electrode or a secondary electrode may be integrated into a multilayer antireflective coating.

In some embodiments, the anti-reflective coating may include combinations of one or more of the aforementioned oxides and/or one or more of the aforementioned fluorides. Example anti-reflective coatings may include: (a) one of the above-identified oxides, (b) one of the above-identified fluorides, (c) two of the above-identified oxides, (d) one of the above-identified oxides combined with one of the above-identified fluorides, (e) two of the above-identified oxides combined with one of the above-identified fluorides, (f) two of the above-identified oxides combined with two of the above-identified fluorides, or (g) three of the above-identified oxides. By way of example, a multilayer stack may include a layer of zinc oxide disposed directly over an electrode and a layer of silicon dioxide disposed over the layer of zinc oxide, although further combinations are contemplated.

In accordance with some embodiments, an antireflective coating may operate to gradually decrease the refractive index between that of the electroactive layer and an adjacent, typically lower index material. In various embodiments, an antireflective coating may include multiple layers of varying refractive index and/or one or more layers having a refractive index gradient.

An ARC layer may have any suitable thickness, including, for example, a thickness of approximately 10 nm to approximately 1000 nm, e.g., approximately 10, 20, 50, 100, 200, 500, or 1000 nm, including ranges between any of the foregoing values, with an example thickness range of approximately 50 nm to approximately 100 nm.

In various embodiments, the one or more layers within an antireflective coating may be fabricated using any suitable process. For example, the ARC layer(s) may be fabricated using physical vapor deposition (PVD), chemical vapor deposition (CVD), atomic layer deposition (ALD), evaporation, spray-coating, spin-coating, dip-coating, screen printing, Gravure printing, ink jet printing, aerosol jet printing, doctor blading, and the like.

In some embodiments, a multilayer actuator stack may include a barrier layer. A suitable barrier layer may operate as a functional coating adapted to decrease the transpiration of water, water vapor, or other liquids or gases. In certain embodiments, a barrier layer may be configured to inhibit the permeation of water vapor to less than approximately $10^{-6}$ g/m$^2$/day and/or inhibit the permeation of oxygen to less than approximately $10^{-5}$ cm$^3$/m$^2$/day. According to further embodiments, a barrier layer may improve the mechanical robustness of a multilayer actuator, e.g., via crack blunting and/or vibration reduction. A barrier layer may be colorless, chemically inert, electrically insulating, and/or scratch resistant and may include various epoxy compounds. In some embodiments, an antireflective coating, e.g., one or more layers within a multilayer antireflective coating, may serve as a barrier layer.

A bonding layer, such as an optical adhesive, may be used to join adjacent layers within a multilayer structure. According to some embodiments, a bonding layer may include a pressure-sensitive adhesive (PSA) such as one or more acrylate-based polymers derived from soft monomers (i.e., low $T_g$ monomers for tack and flexibility), hard monomers (i.e., high $T_g$ monomers for cohesion strength) and functional monomers (e.g., for adhesion strength). Example PSA materials include 2-ethylhexyl acrylate (2-EHA), methyl methacrylate (MMA), butylacrylate, hexylacrylate, isooctylacrylate, 2-hydroxyethyl acrylate (2-HEA), lauryl acrylate (LA), acrylic acid (AA), 2-phenoxy ethyl acrylate (2-PEA), etc. In some embodiments, such acrylates may be functionalized with a cross linking agent, such as aluminum acetylacetonate (AlAcAc), zirconium acetylacetonate (ZrAcAc), hafnium carboxyethyl acrylate (HCA), and the like.

In some embodiments, the barrier layer and/or the bonding layer may include a double network tough adhesive (DNTA). A DNTA, which may be colorless and optically clear, may include a high-performance PSA with acid and epoxy functionalities combined with an acrylated urethane oligomer, a methacrylated silane thermoset cross-linker, and/or a photo-initiator (e.g., a metal chelate ionic cross-linker).

In accordance with certain embodiments, an optical element such as a multilayer actuator may include a passive support, which may include a glass, ceramic, polymer or other dielectric composition. An example passive support may include sapphire. A passive support may influence the mechanical performance of the actuator including its stiffness and buckling response. In some embodiments, the support may include a planar, meniscus, or ophthalmic glass substrate. In some embodiments, a bonding layer may be used to affix the passive support to the actuator architecture. The passive support may be optically transparent.

In accordance with certain embodiments, a transparent actuator including an electroactive layer disposed between transparent electrodes may be incorporated into a variety of device architectures where capacitive actuation and the attendant strain realized in the electroactive layer (e.g., lateral expansion and compression in the direction of the applied electric field) may induce deformation in one or more adjacent active layers within the device and accordingly change the optical performance of the active layer(s). Lateral deformation may be essentially 1-dimensional, in the case of an anchored thin film, or 2-dimensional.

In certain applications, such as a liquid lens, where a high net displacement over a large surface area may be beneficial, the onset of buckling instabilities may decrease the accessible actuation range for some multilayer actuator geometries. Buckling may occur when a structure is loaded above a critical compressive stress, which for a transparent actuator may be related to the stress induced via the indirect piezoelectric effect. According to some embodiments, however, the usable actuation range otherwise limited by a buckling instability may be improved through appropriate mechanical design, e.g., to increase the critical compressive stress of the electroactive layer(s).

In some embodiments, an optical device may include a liquid lens. As will be appreciated, in accordance with various embodiments, a liquid lens fitted with a multilayer actuator may provide varifocal accommodation with high see-through quality and effective actuation within a commercially-relevant form factor. That is, a liquid lens having a transparent multilayer actuator functioning as a deformable surface is an attractive solution to meet space constraints.

According to further embodiments, a drive scheme architecture may be dependent on poling conditions as well as the overall device structure, e.g., unimorph or bimorph. According to various embodiments, a multilayer actuator may include a primary electrode, a secondary electrode overlapping at least a portion of the primary electrode, and an electroactive layer disposed between and abutting the primary electrode and the secondary electrode.

The application of a voltage between the electrodes can cause compression or expansion of the intervening electroactive layer in the direction of the applied electric field and an associated expansion or contraction of the electroactive layer in one or more transverse dimensions. In some embodiments, an applied voltage (e.g., to the primary electrode and/or the secondary electrode) may create at least approximately 0.02% strain in the electroactive layer (e.g., an amount of deformation in the direction of the applied force resulting from the applied voltage divided by the initial dimension of the material) in at least one direction (e.g., an x, y, or z direction with respect to a defined coordinate system).

An electrical signal may include a potential difference, which may include a direct or alternating voltage. In some embodiments, the frequency may be higher than the highest mechanical response frequency of the device, so that deformation may occur in response to the applied RMS electric field but with no appreciable oscillatory mechanical response to the applied frequency. The applied electrical signal may generate non-uniform constriction of the electroactive layer between the primary and secondary electrodes. A non-uniform electroactive response may include a curvature of a surface of the optical element, which may in some embodiments be a compound curvature.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-29, detailed descriptions of electroactive actuators and active liquid lenses incorporating such actuators. The discussion associated with FIGS. 1-5 includes a description of the structure and performance of example bimorph actuators. The discussion associated with FIGS. 6-13 includes a description of lens profile data in response to uniform and non-uniform actuation using an integrated electroactive actuator. The discussion associated with FIGS. 14-16 includes a description of example segmented electrode architectures for applying an actuation voltage over a selected area of an electroactive actuator. The discussion associated with FIGS. 17-19 includes a description of poling methods for generating a layer of electroactive material exhibiting spatially-localized actuation. The discussion associated with FIGS. 20 and 21 includes a description of bimorph actuators integrated with a liquid lens. The discussion associated with FIGS. 22-24 includes a description of the stress state realized across a liquid lens following the application of uniform and non-uniform voltages to an electroactive actuator integrated with a liquid lens. The discussion associated with FIGS. 25-27 includes a description of the applied voltage, vertical displacement, and optical power associated with a liquid lens integrated with a unimorph actuator. The discussion associated with FIGS. 28 and 29 relates to exemplary virtual reality and augmented reality devices that may include an electroactive actuator as disclosed herein.

Referring to FIG. 1, shown is a plot of cylindricity versus optical power for example liquid lenses each integrated with a respective bimorph electroactive actuator. With increasing optical power, the data in FIG. 1 show a generally increasing cylindricity for the example lenses with an instability onset associated with a cylindricity of approximately 0.1. That is, with increasing optical power, a large incremental change in cylindricity is observed for cylindricity values greater than approximately 0.1, which may accompany the onset of buckling of the lenses. As used herein, "cylindricity" may, in certain examples, refer to a condition of a surface of revolution in which all points are equidistant from a common axis.

For a uniformly applied voltage 110, an optical power of approximately 0.65 diopters may be achieved prior to the onset of significant cylindricity, whereas for a non-uniformly applied voltage 120, an optical power of approximately 1 diopter may be realized. As will be appreciated, by applying a non-uniform voltage to the actuator and accordingly modifying the local mechanical forces generated in one or more of the actuator layers, the tendency for buckling of the actuator (and a lens coupled to the actuator) may be decreased, which allows higher degrees of curvature to be achieved before an instability onset. In the embodiment of FIG. 1, buckling may derive from the actuator deforming into a cylindrical shape rather than a spherical shape.

As used herein, "optical power" at a point on the surface of a lens may be defined as $(n-1)*(curv1+curv2)/2$, where curv1 and curv2 are the two principal curvatures on the surface of the lens, and n is the refractive index. "Cylindricity" at a point is defined as $(n-1)*abs(curv1-curv2)/2$. Optical power and cylindricity values can be averaged over the full lens surface or over a central region, which may be relevant for certain applications. If an initially flat lens deforms in a perfect spherical shape, curv1 and curv2 will be equal, optical power will therefore increase, and cylindricity will be zero. If a lens deforms into a perfect cylinder, then either curv1 or curv2 will be zero. In this case both optical power and cylindricity will increase equally.

Figure 2:
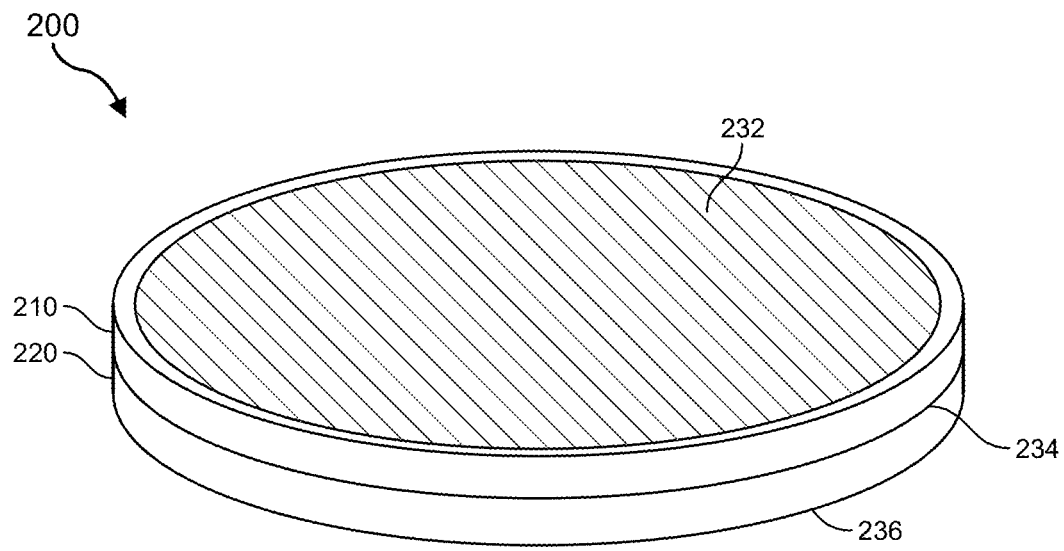
FIG. 2 is a perspective view of an example bimorph actuator according to certain embodiments.

A schematic illustration of an electroactive actuator is shown in FIG. 2. Bimorph actuator 200 may be integrated with a liquid lens (not shown) and may include a first electroactive layer 210 overlying a second electroactive layer 220. The electroactive layers 210, 220 may be compositionally equivalent or compositionally distinct. For instance, in an example bimorph actuator, one electroactive layer may include a piezoelectric composition and the other electroactive layer may include an electrostrictive material.

A primary electrode 232 may be disposed over (i.e., bonded to) a top surface of the first electroactive layer 210, a secondary electrode 234 may be disposed between the first electroactive layer 210 and the second electroactive layer 220, and a tertiary electrode 236 may be disposed over (i.e., bonded to) a bottom surface of the second electroactive layer 220. In some embodiments, the primary electrode 232 and the tertiary electrode 236 may each be connected to a respective voltage source (not shown) while the secondary electrode 234 may be connected to ground. In some embodiments, the secondary electrode 234 may be omitted. A voltage may be applied to one or more of the electrodes 232, 234, 236 to deflect the electroactive layers 210, 220 and change the optical power of the lens.

Figure 3:
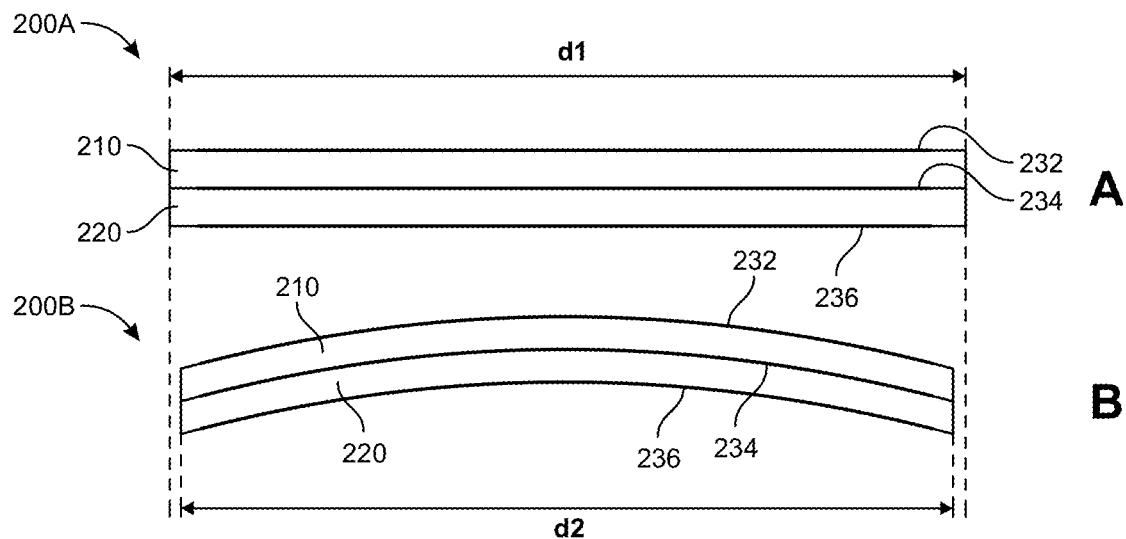
FIG. 3 is a cross-sectional view illustrating the actuation response of the bimorph actuator of FIG. 2 according to certain embodiments.

A cross-sectional view of the electroactive bimorph actuator 200 of FIG. 2 is shown in FIG. 3 in both unactuated and actuated states. Referring initially to FIG. 3A, the un-biased, substantially planar actuator 200A may be characterized by a diameter (d1). In an actuated state, however, the actuator may deform as shown in FIG. 3B, and may be characterized by a convex upper surface defined by primary electrode 232 and a concave lower surface defined by tertiary electrode 236. In some embodiments, the convex upper surface may be characterized by a compound curvature.

As used herein, the term "substantially" in reference to a given parameter, property, or condition may mean and include to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least approximately 90% met, at least approximately 95% met, or even at least approximately 99% met.

As will be appreciated, with a uniformly-applied bias, the deformed actuator 200B may have a diameter (d2) where d2<d1. Without wishing to be bound by theory, relative to the unbiased actuator 200A, the decreased radial dimension of the biased actuator 200B may contribute to an increased compressive hoop stress exerted on the actuator, which may lead to buckling of an integrated liquid lens when the deformation progresses beyond a certain curvature, i.e., in association with the generation of cylindrical curvature rather than spherical curvature.

Figure 4:
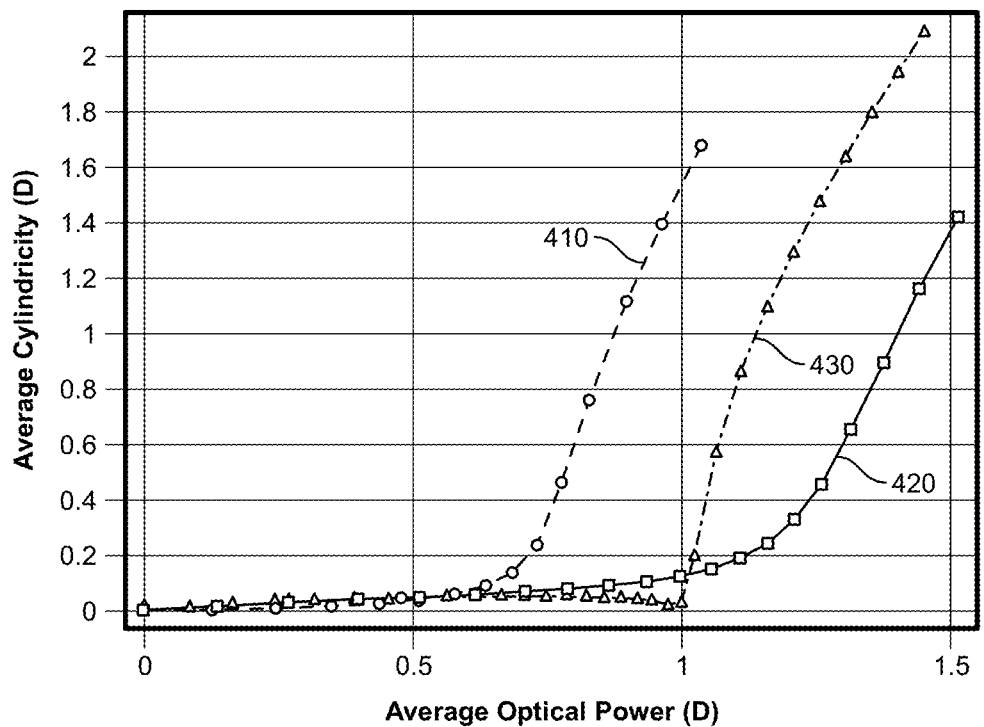
FIG. 4 is a plot of cylindricity versus optical power for a lens integrated with example electroactive actuators according to various embodiments.

Referring to FIG. 4, shown is a plot comparing the effect of increasing optical power on the cylindricity of bimorph actuator 200 for a uniform voltage distribution 410, a non-uniform voltage distribution 420, and an adjusted non-uniform voltage distribution 430. For each example, a voltage is applied across biaxially-oriented PVDF layers 210, 220, where the secondary electrode 234 is electrically grounded. As used herein, an "adjusted" voltage distribution, an "adjusted" bias, etc. may, in some examples, refer to a spatial voltage distribution that is configured to decrease cylindricity while also decreasing variation of the optical power across an active lens, and hence achieve better optical behavior. A corresponding plot for bimorph 200 showing the difference between maximum and minimum optical power as a function of the average optical power is shown in FIG. 5.

Figure 5:
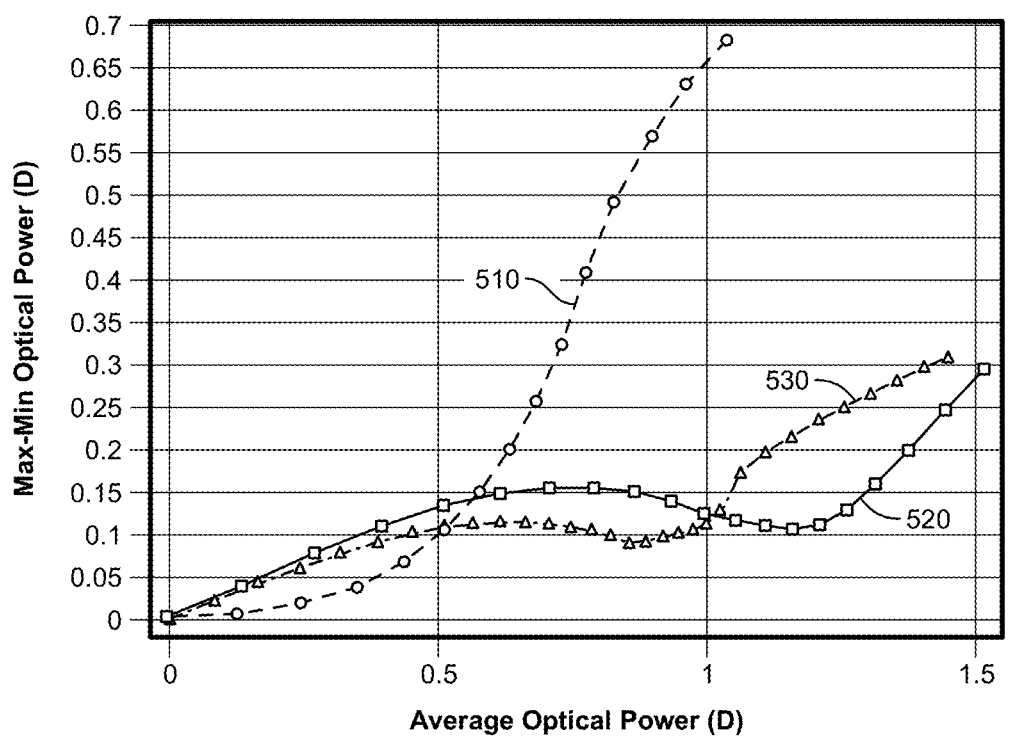
FIG. 5 is a plot showing the impact of increasing average optical power on the difference between maximum and minimum optical power across a lens integrated with electroactive actuators according to various embodiments.

With reference to FIGS. 4 and 5, for an optical power or average optical power of approximately 1.0 diopter, which may be a threshold achievable value for many commercial applications, a uniform voltage distribution 410, 510 leads to instability and buckling of the lens. However, suppression of the buckling response at 1.0 diopter is observed for non-uniform voltage distributions 420, 520, as well as for adjusted non-uniform voltage distributions 430, 530. Buckling may accompany an increase in cylindricity and an increase in the difference between maximum and minimum optical power across the lens.

In accordance with various examples, the performance and operating conditions of active liquid lenses are shown in FIGS. 6-13. The example liquid lenses include a lens fluid having a refractive index of 1.67 and also include an integrated bimorph actuator (e.g., actuator 200) having a pair of poled PVDF layers each characterized by equal transverse piezoelectric coefficients (d31 and d32). The thickness of the electroactive layers may each be approximately 50 micrometers.

Relative to a uniformly applied voltage, a non-uniform voltage and an adjusted non-uniform voltage may each decrease the creation of cylindricity and appreciably suppress the onset of lens buckling and enable more uniform optics in example liquid lenses. In certain embodiments, the non-uniform voltage may be characterized as a spatially non-uniform, quadratically varying voltage distribution.

Figure 6:
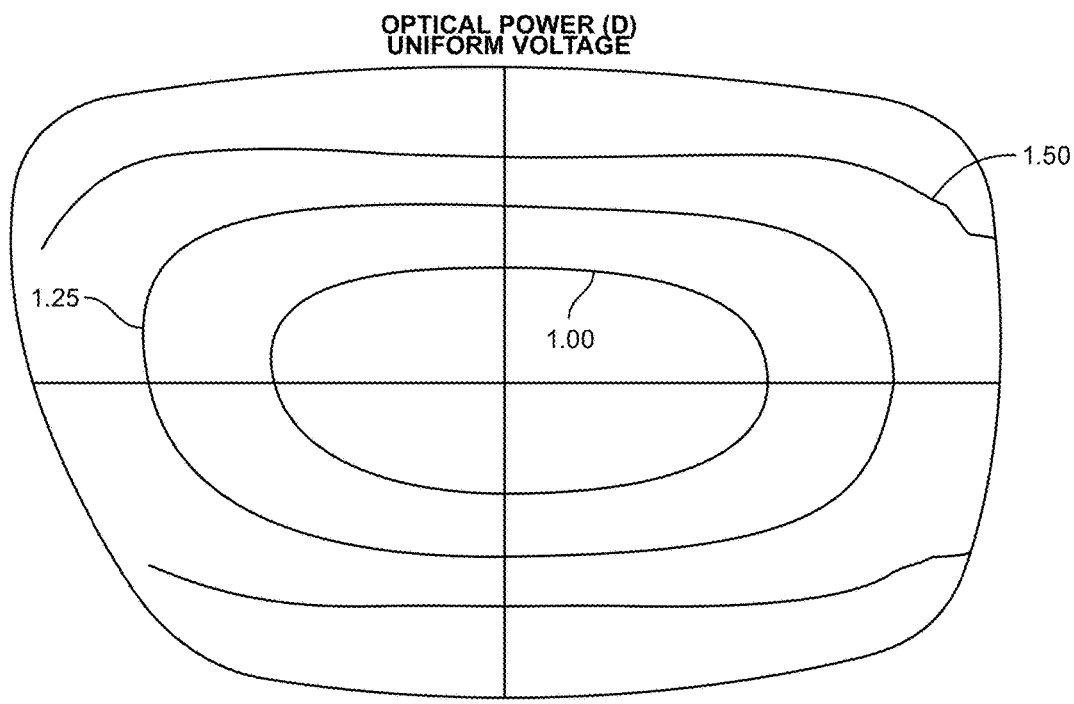
FIG. 6 is a contour plot showing the variation in diopters for a lens with a uniform voltage applied to the top electroactive layer of an integrated bimorph actuator according to some embodiments.
Figure 7:
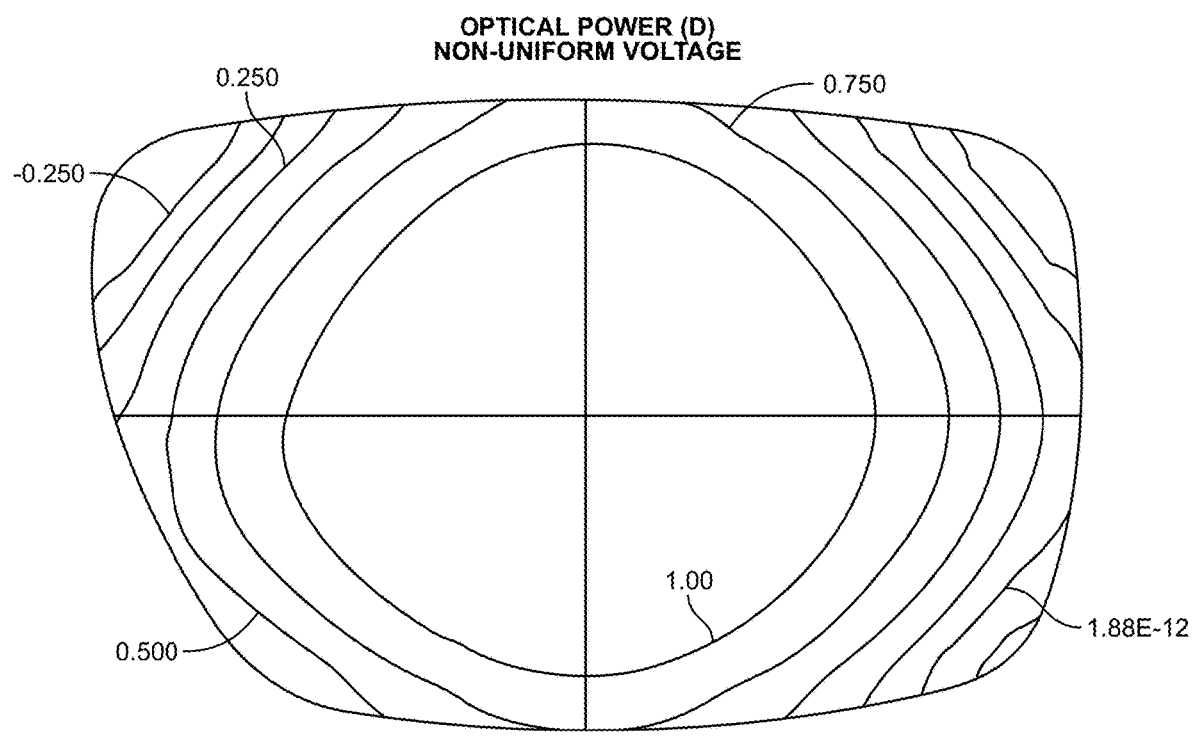
FIG. 7 is a contour plot showing the variation in diopters for a lens with a non-uniform voltage applied to the top electroactive layer of an integrated bimorph actuator according to some embodiments.
Figure 8:
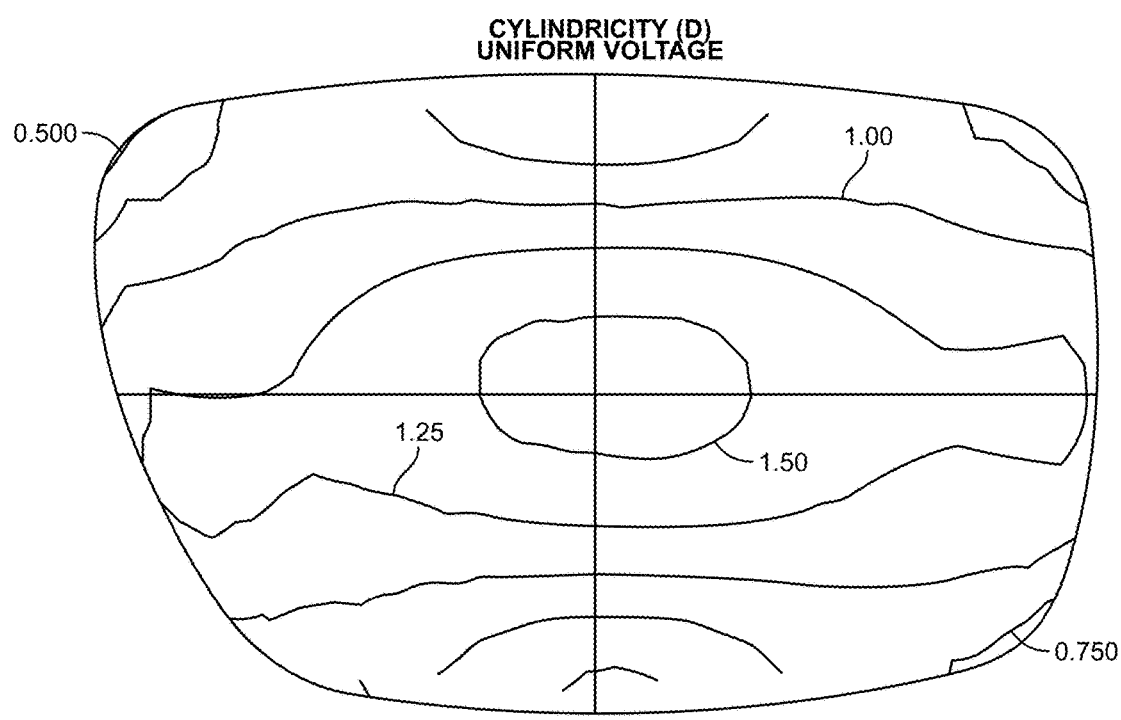
FIG. 8 is a contour plot showing the cylindricity in diopters for a lens with a uniform voltage applied to the top electroactive layer of an integrated bimorph actuator according to some embodiments.
Figure 9:
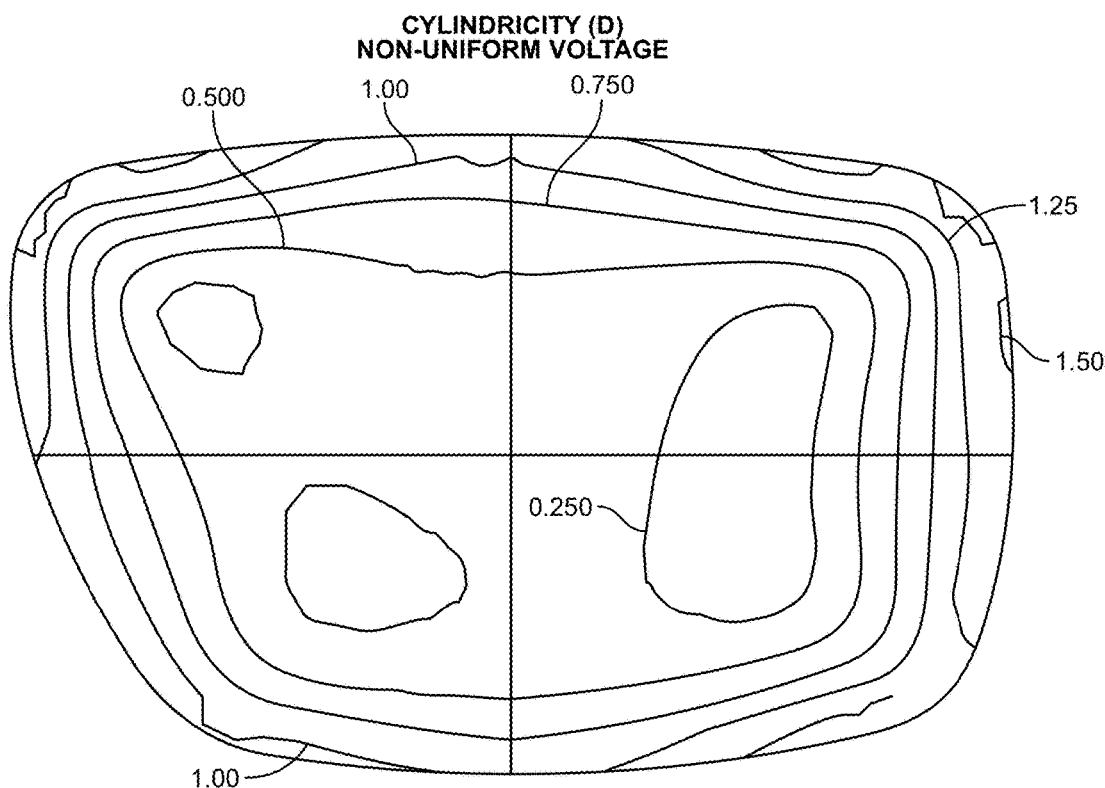
FIG. 9 is a contour plot showing the cylindricity in diopters for a lens with a non-uniform voltage applied to the top electroactive layer of an integrated bimorph actuator according to some embodiments.
Figure 10:
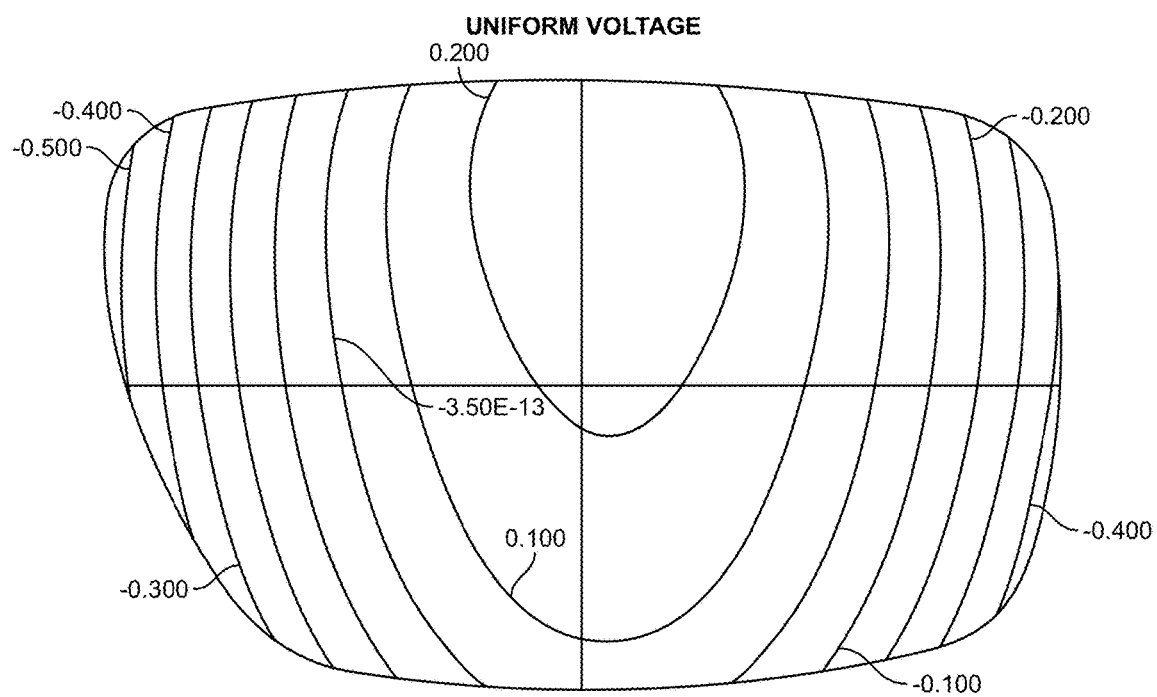
FIG. 10 is a contour plot showing the net displacement of a lens having a uniform voltage applied to the top electroactive layer of an integrated bimorph actuator according to certain embodiments.
Figure 11:
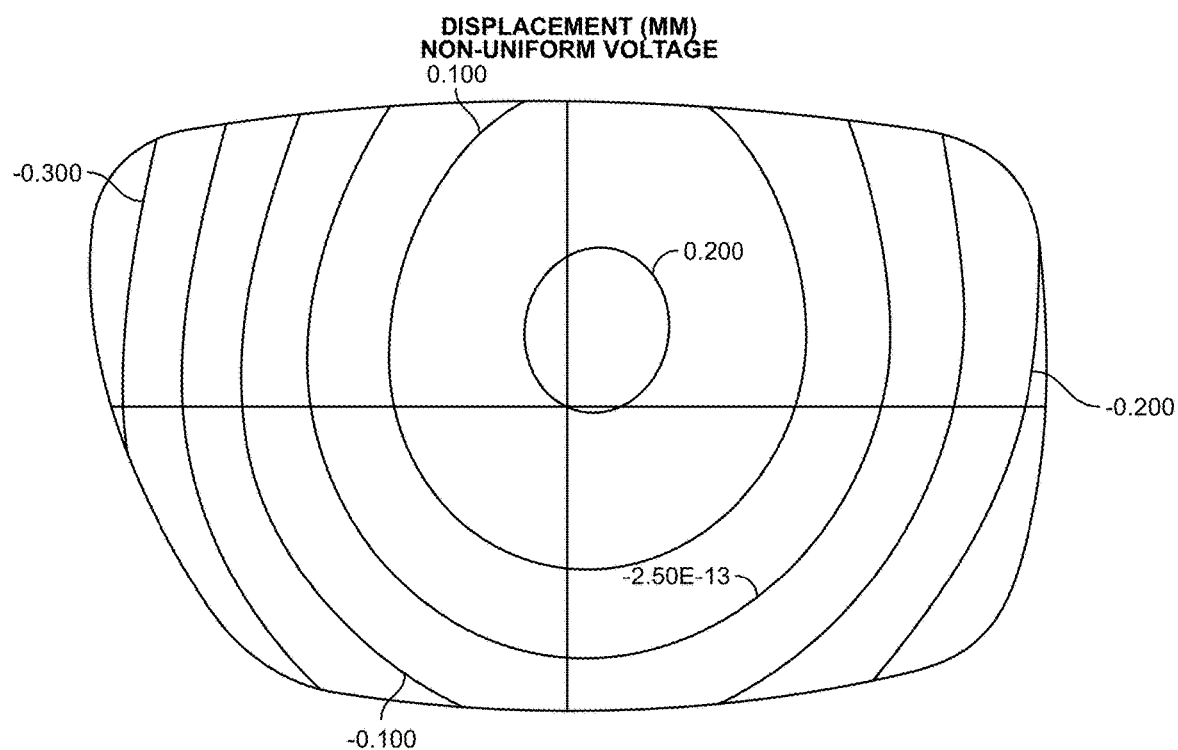
FIG. 11 is a contour plot showing the net displacement of a lens having a non-uniform voltage applied to the top electroactive layer of an integrated bimorph actuator according to certain embodiments.
Figure 12:
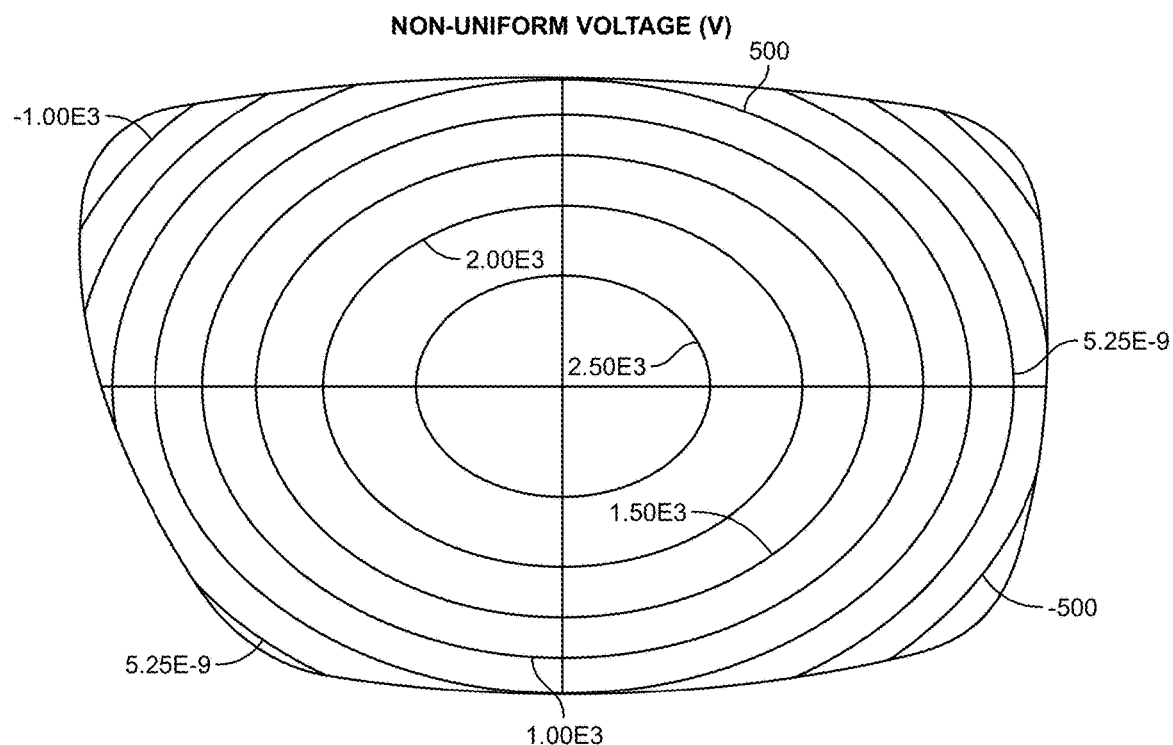
FIG. 12 is a contour plot showing the non-uniform voltage applied to the top electroactive layer of the integrated bimorph actuators of FIGS. 7, 9, and 11 according to certain embodiments.
Figure 13:
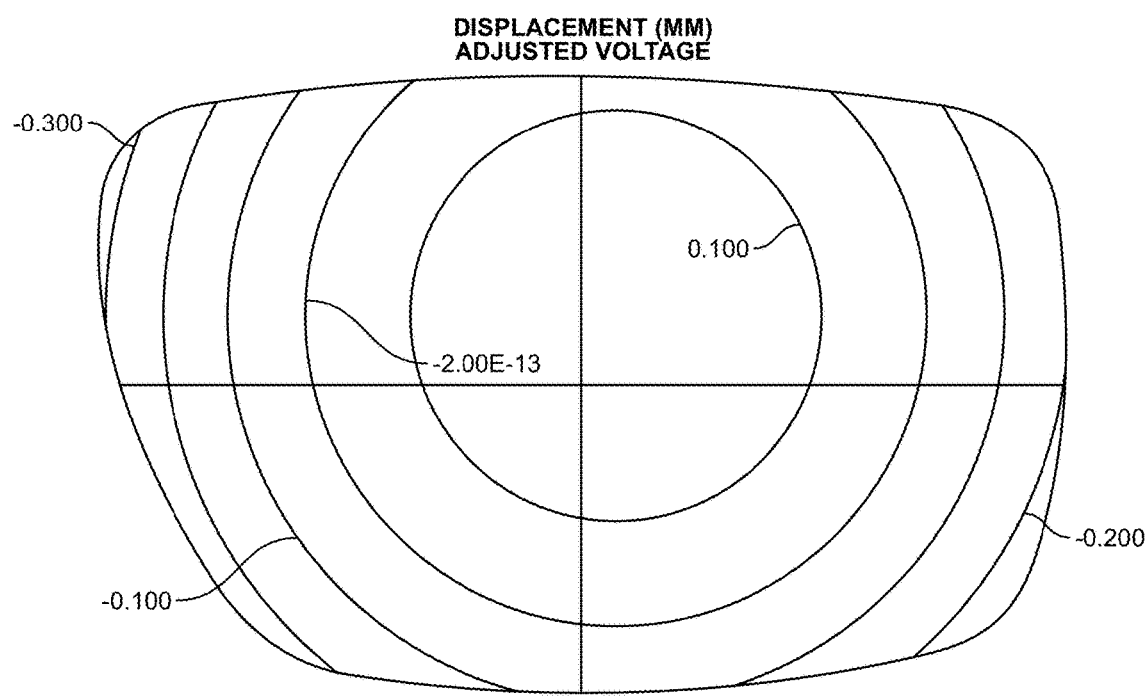
FIG. 13 is a contour plot showing the realizable net displacement for a lens having an adjusted non-uniform voltage applied to the top electroactive layer of an integrated bimorph actuator according to certain embodiments.

With reference to FIGS. 6 and 7, shown are contour plots of optical power in diopters for an active liquid lens having a uniformly applied voltage and a non-uniformly applied voltage applied to the top layer of the bimorph. Contour plots of cylindricity for a uniformly applied voltage and a non-uniformly applied voltage are shown in FIGS. 8 and 9. Displacement profiles for the lenses in response to the uniformly applied voltage and the non-uniformly applied voltage are shown in FIGS. 10 and 11. As will be appreciated, the contours of optical power in FIG. 7 are more uniform close to the center of the lens compared to the contours of FIG. 6. The contours of cylindricity in FIG. 9 are lower close to the center of the lens compared to the contours of FIG. 8. Also, the contours of displacement in FIG. 11 are more axisymmetric than the contours in FIG. 10. The non-uniform voltage profile used to generate the contours in FIGS. 7, 9, and 11 is shown in FIG. 12. A displacement profile for the lens in response to the application of an adjusted non-uniform voltage is shown in FIG. 13. The displacements in this case are more axisymmetric than the contours in both FIGS. 10 and 11.

A variety of methods and structures may be used to create and apply a spatially non-uniform voltage profile, including an adjusted non-uniform voltage. According to certain embodiments, a bias may be applied locally across one or more electroactive layers using patterned electrodes. That is, an electrode may be patterned to form plural segments where each segment of a multi-segmented electrode may be independently biased. A localized bias may be used to tailor the displacement of the actuator and hence the deformation of an adjacent liquid lens and accordingly control the geometry of the lens, including the degree of imputed cylindricity. In an actuator including multiple electrodes, e.g., a primary electrode and a secondary electrode, one or more of the electrodes may be a patterned (segmented) electrode.

Figure 14:
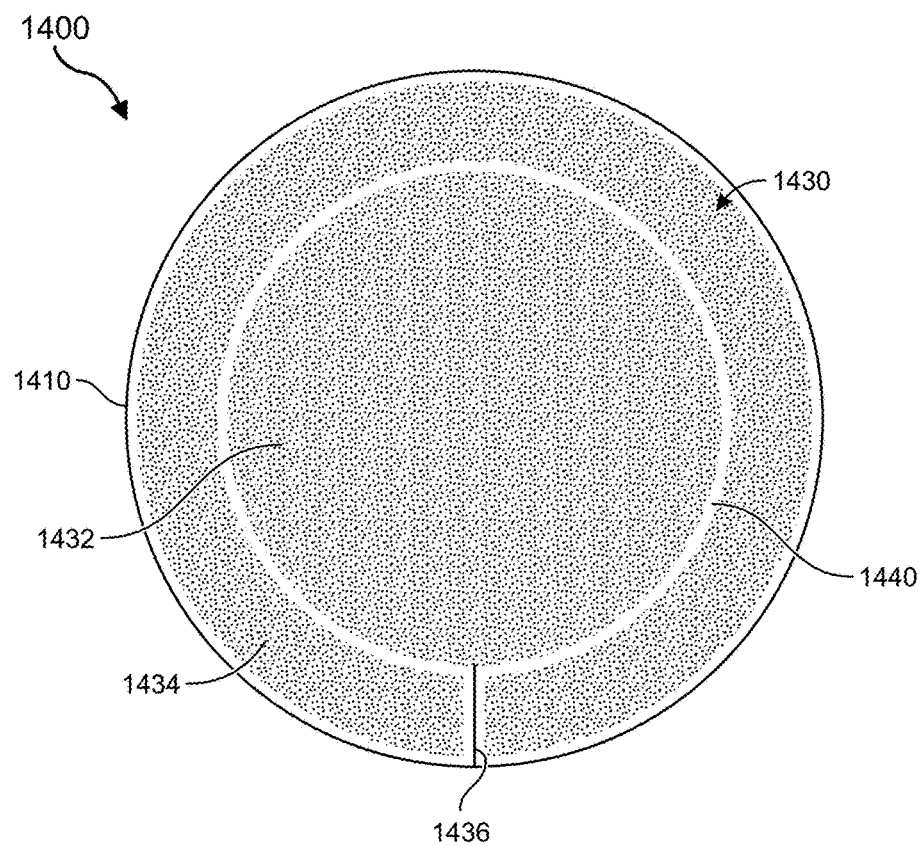
FIG. 14 is a schematic plan view of a segmented electrode having an annular conductive zone peripheral to a central conductive zone according to some embodiments.

A top-down, plan view schematic illustration of a bimorph actuator having a segmented electrode is shown in FIG. 14. Actuator 1400 includes an electroactive layer 1410 and a radially-partitioned electrode 1430 disposed over a top surface of the electroactive layer 1410. Segmented electrode 1430 includes a central region 1432 and an annular region 1434 surrounding the central region 1432. Central region 1432 and annular region 1434 may be electrically isolated by a gap 1440. An electrical connection to the central region 1430 of segmented electrode 1430 may be made via a radially-extending contact 1436.

In the embodiment of FIG. 14, although a single annular region 1434 is shown, additional example actuators may include two or more annular regions arranged about an optional central region. In such examples, the radial thickness of each annular region may independently range from approximately 5% to approximately 90% of a radius of the actuator, e.g., approximately 5%, approximately 10%, approximately 20%, approximately 30%, approximately 40%, approximately 50%, approximately 60%, approximately 70%, approximately 80%, or approximately 90% of the radius, including ranges between any of the foregoing values.

Figure 15:
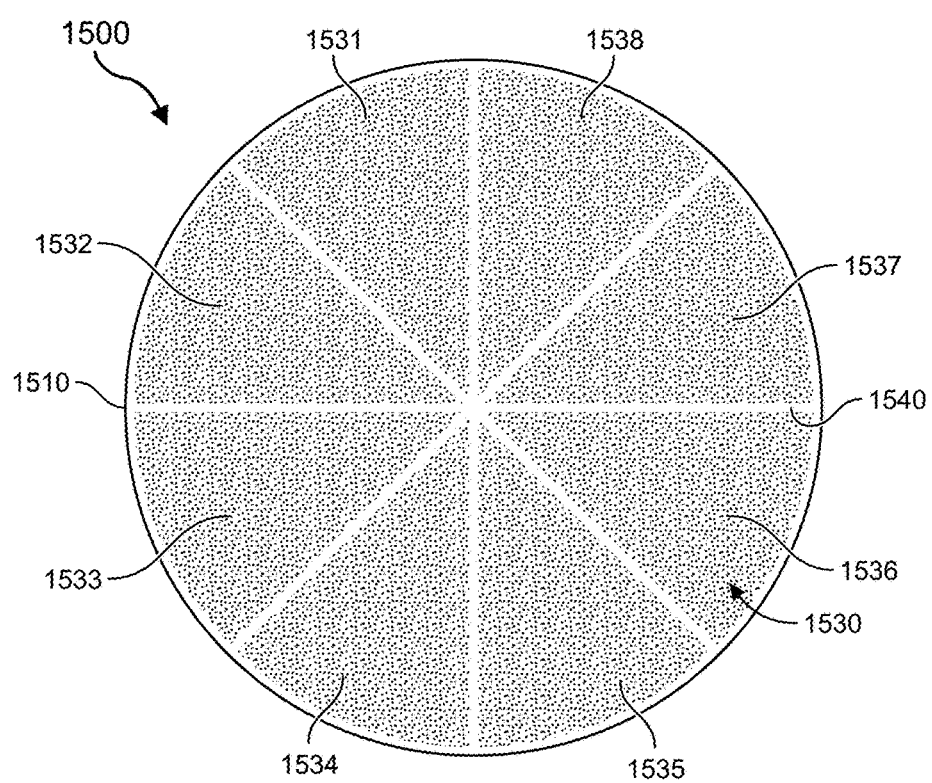
FIG. 15 is a schematic plan view of an electrode having radially segmented conductive zones according to some embodiments.

A further top-down, plan view schematic illustration of a bimorph actuator having a segmented electrode is shown in FIG. 15. Actuator 1500 includes an electroactive layer 1510 and a circumferentially-partitioned electrode 1530 disposed over a top surface of the electroactive layer 1510. Segmented electrode 1530 includes a plurality of wedge-shaped elements 1531-1538 configured to be biased independently. Each adjacent wedge-shaped element pair may be electrically isolated by a radially-extending gap 1540. Although eight elements 1531-1538 are shown, a segmented electrode having fewer or greater number of such elements is contemplated.

Figure 16:
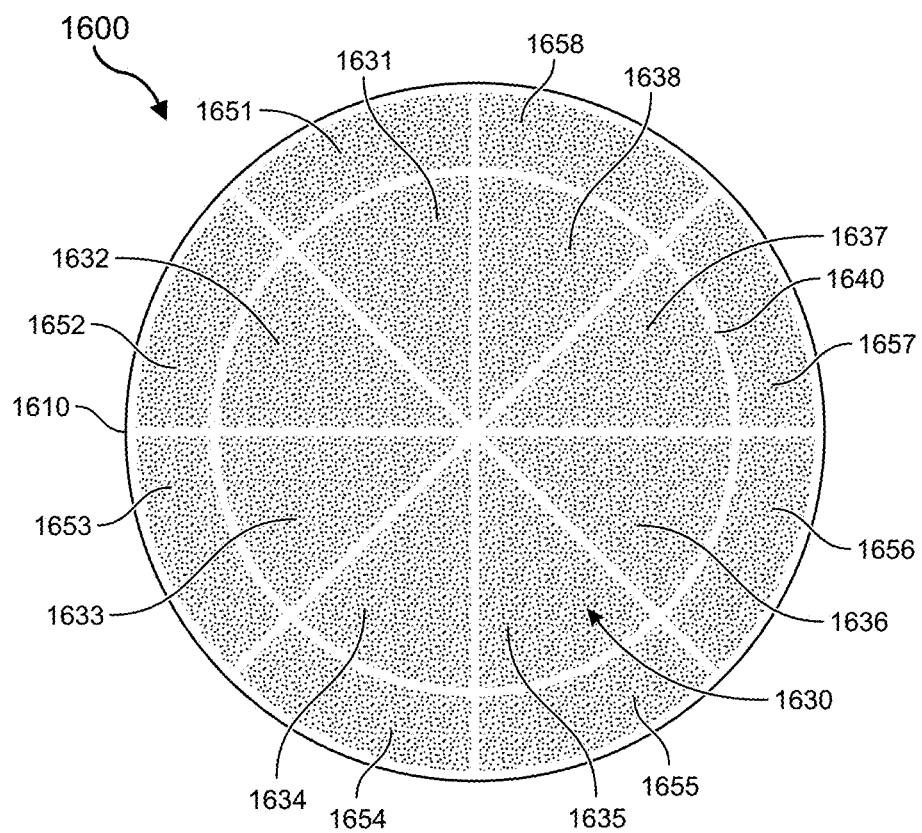
FIG. 16 is a schematic plan view of a hybrid segmented electrode partitioned annularly and radially according to various embodiments.

A still further schematic illustration of a bimorph actuator having a segmented electrode is shown in FIG. 16. Actuator 1600 includes an electroactive layer 1610 and a segmented electrode 1630 for driving the actuator disposed over a top surface of the electroactive layer 1610. In the embodiment of FIG. 16, segmented electrode 1630 includes a plurality of wedge-shaped elements 1631-1638 and a corresponding plurality of annular elements 1651-1658 arranged peripheral to the wedge-shaped elements 1631-1638. Adjacent conductive regions of segmented electrode 1630 may be separated by gaps 1640, which may include both radial and circumferential portions.

Although actuators 1400, 1500, 1600 are described as having a circular shape, it will be appreciated that the actuator shape is not particularly limited, and may include further geometries, such as an oval, elliptical, ovate, or prolate architecture.

In accordance with various embodiments, deformation of an active lens, including control of lens cylindricity and spheriodicity, may be controlled using one or more segmented electrode architectures. Moreover, additional methods and structures may be used in lieu of or in conjunction with segmented electrodes. For instance, rather than applying a localized voltage to a uniform electroactive layer, a uniform voltage may be applied to an electroactive layer having a spatially modified piezoelectric coefficient.

Figure 17:
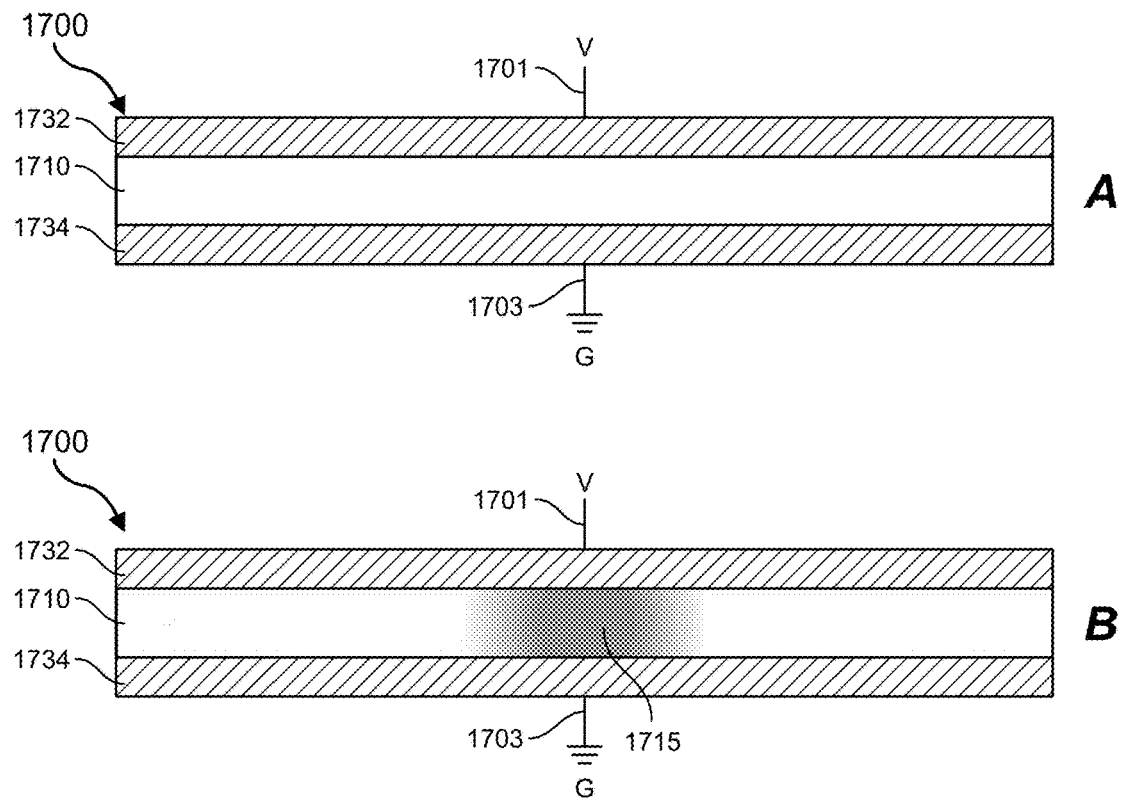
FIG. 17 is a cross-sectional view of a system for locally poling a layer of electroactive material according to certain embodiments.

Turning to FIG. 17, shown is a perspective view of a poling system that may be used to pole a layer of piezoelectric material. Poling system 1700 includes a layer of piezoelectric material 1710 disposed between a primary electrode 1732 and a secondary electrode 1734. The primary electrode 1732 may be connected to a voltage source 1701, and the secondary electrode 1734 may be connected to ground 1703. Referring to FIG. 17A, a uniformly poled piezoelectric material may be formed by heating the piezoelectric layer 1710 above its Curie temperature, applying a voltage across the layer of piezoelectric material 1710, and cooling the piezoelectric material 1710 while maintaining the applied voltage.

A layer of piezoelectric material having a spatially varying piezoelectric performance may be formed in accordance with the process illustrated in FIG. 17B where poling system 1700 includes a layer of piezoelectric material 1710 disposed between a primary electrode 1732 and a secondary electrode 1734. The primary electrode 1732 may be connected to a voltage source 1701, and the secondary electrode 1734 may be connected to ground 1703.

In some embodiments, the degree of poling within the layer of piezoelectric material 1710 may be locally defined by applying a voltage while heating and cooling one or more selected regions thereof. By way of example, as illustrated in FIG. 17B, a first voltage (V1) may be applied across the layer of piezoelectric material 1710 while a region 1715 of the piezoelectric material 1710 is heated above its Curie temperature and then cooled, i.e., while maintaining the first voltage. The voltage may be changed to a second voltage (V2), and another region of the piezoelectric layer may be heated and cooled while maintaining the second voltage (V2). This process may be repeated to create a layer of piezoelectric material 1710 where the degree of piezoelectric response is tailored spatially.

According to further embodiments, a constant voltage may be used to pole the piezoelectric layer. In such methods, the poling time and/or the poling temperature may be changed locally to affect a variation in the piezoelectric response. By way of example, a 100 micrometer thick PVDF-TrFE polymer thin film may be placed between two electrodes and a 5 kV voltage may be applied to the primary electrode. During application of the voltage, a first region of the polymer thin film may be heated to approximately 200° C. for approximately 30 seconds and then cooled. Subsequently, while applying the same voltage, a second region of the polymer thin film may be heated to approximately 200° C. for approximately 5 seconds and then cooled.

Regional heating may be achieved using one or more local heating sources, including a laser beam. In some embodiments, a spatial light modulator may be used with a radiation source to locally heat the electroactive material.

Figure 18:
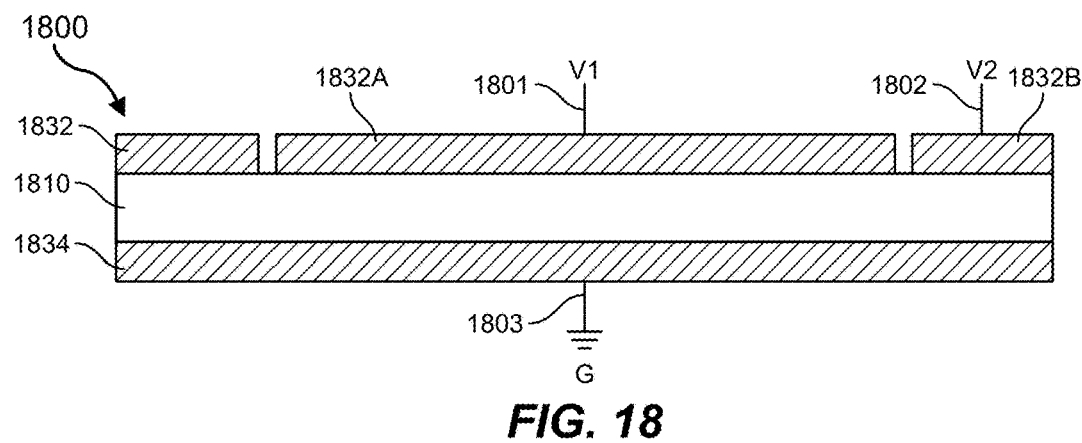
FIG. 18 is a cross-sectional view showing the localized poling of a layer of electroactive material using a patterned electrode according to certain embodiments.

Referring to FIG. 18, illustrated is a further example method to effect spatially localized poling of a piezoelectric layer. Poling system 1800 includes a layer of piezoelectric material 1810 disposed between a primary electrode 1832 and a secondary electrode 1834. Primary electrode 1832 may be partitioned into a first electrode segment 1832A and a second electrode segment 1832B, where first electrode segment 1832A may be connected to a first voltage source 1801 and second electrode segment 1832B may be connected to second voltage source 1802. In the illustrated embodiment, secondary electrode 1834 may be connected to ground 1803. First voltage (V1) and second voltage (V2) may be applied across the layer of piezoelectric material 1810 within respective regions thereof while the piezoelectric material 1810 is heated above its Curie temperature and then cooled, i.e., while maintaining the first and second voltages. According to certain embodiments, poling voltages (V1, V2) may be applied simultaneously or in succession.

Figure 19:
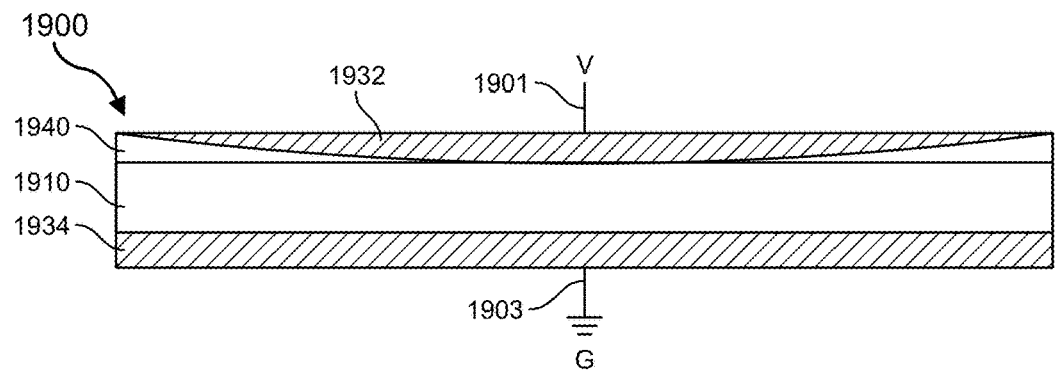
FIG. 19 is a cross-sectional view showing the localized poling of an electroactive layer using a sacrificial dielectric layer according to certain embodiments.

A further approach to create regional variation in piezoelectric performance is shown in FIG. 19, where poling system 1900 includes a layer of piezoelectric material 1910 overlying a secondary electrode 1934 and a shaped dielectric layer 1940 is disposed between the layer of piezoelectric material 1910 and an overlying primary electrode 1932. Primary electrode 1932 may be connected to a voltage source 1901, and secondary electrode 1934 may be connected to ground 1903. As will be appreciated, the thickness and the dielectric constant of shaped dielectric layer 1940 may be used to locally modify the strength of the electric field within the layer of piezoelectric material 1910. During the act of poling, the piezoelectric layer 1910 may be uniformly heated and cooled, and a desired pattern of piezoelectric response may be generated in the piezoelectric layer 1910.

Figure 20:
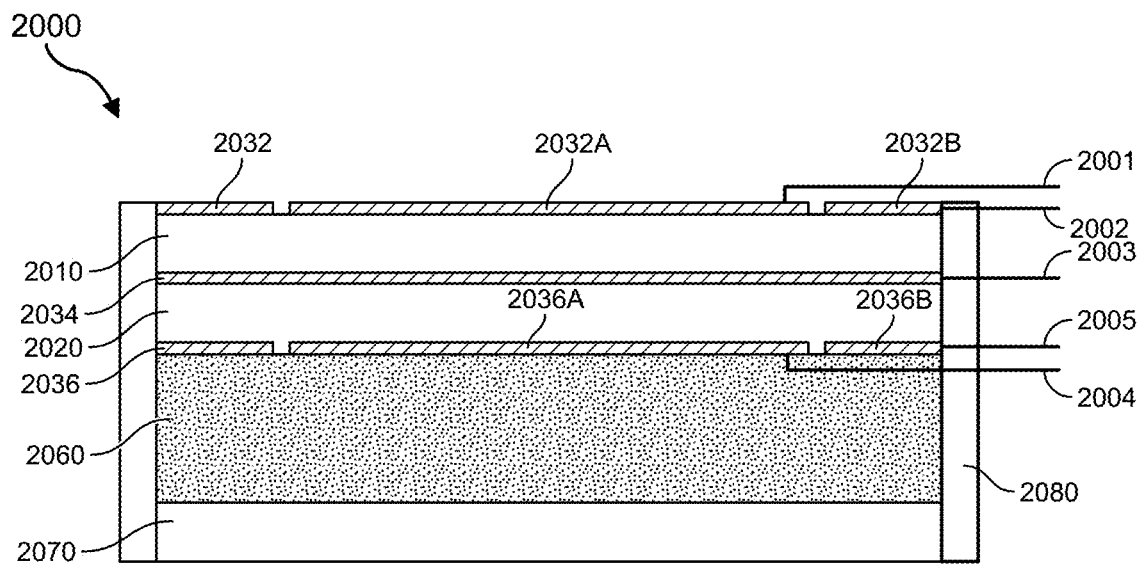
FIG. 20 is a cross-sectional view of a liquid lens having an integrated electroactive bimorph actuator with segmented electrodes according to some embodiments.
Figure 21:
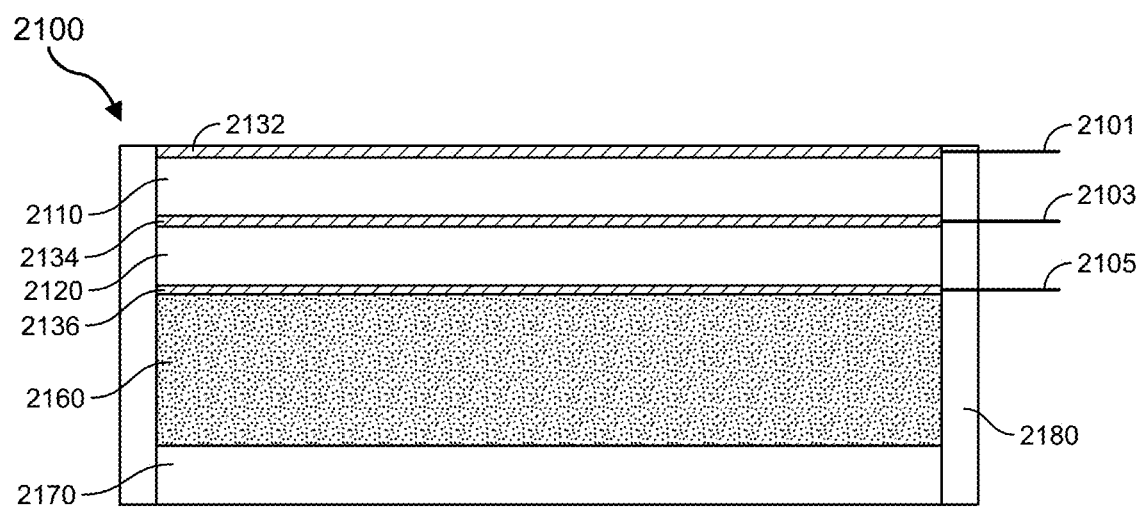
FIG. 21 is a cross-sectional view of a liquid lens having an integrated electroactive actuator configured to exhibit a spatially non-uniform electroactive response according to some embodiments.

Example liquid lenses configured to generate compound curvature are shown schematically in cross-section in FIGS. 20 and 21. Referring to FIG. 20, active liquid lens 2000 is co-integrated with an overlying bimorph actuator having a segmented electrode. The bimorph actuator includes a first electroactive layer 2010 overlying a second electroactive layer 2020.

A primary electrode 2032 may be disposed over (i.e., bonded to) a top surface of the first electroactive layer 2010, a secondary electrode 2034 may be disposed between the first electroactive layer 2010 and the second electroactive layer 2020, and a tertiary electrode 2036 may be disposed over (i.e., bonded to) a bottom surface of the second electroactive layer 2020. In some embodiments, the primary electrode 2032 may include a central segment 2032A and a peripheral segment 2032B each connected to a respective voltage source 2001, 2002. The tertiary electrode 2036 may include a central segment 2036A and a peripheral segment 2036B each connected to a respective voltage source 2004, 2005.

In the illustrated embodiment, the central segments 2032A, 2036A and the peripheral segments 2032B, 2036B may be mutually co-extensive. Secondary electrode 2034 may be an un-patterned electrode and may be connected to a voltage source 2003. Alternatively, secondary electrode 2034 may be connected to electrical ground.

The bimorph actuator may overlie a layer of lens fluid 2060, which may include any suitable liquid as known to those skilled in the art. The layer of lens fluid 2060 may overlie a transparent support 2070, and a sealing membrane 2080 may cooperate with the actuator stack and the support 2070 to contain the lens fluid 2060. Based on their high transmissivity and low haze, polymers such as polycarbonate (PC), poly(methyl methacrylate) (PMMA), and polyethylene terephthalate (PET) may be used as the support 2070. In certain embodiments, the support 2070 may be selected to index match the lens fluid 2060. In some embodiments, the layer of lens fluid 2060 may be omitted.

During operation, one or more voltages may be applied to one or more of the electrodes 2032A, 2032B, 2034, 2036A, 2036B to deflect the electroactive layers 2010, 2020 and change the optical power of the lens. In some embodiments, the actuated liquid lens may be characterized by a compound curvature.

Referring to FIG. 21, illustrated is a cross-sectional view of a further example active liquid lens. Active liquid lens 2100 is co-integrated with a bimorph actuator having a first electroactive layer 2110 overlying a second electroactive layer 2120. A primary electrode 2132 may be disposed over (i.e., bonded to) a top surface of the first electroactive layer 2110, a secondary electrode 2134 may be disposed between the first electroactive layer 2110 and the second electroactive layer 2120, and a tertiary electrode 2136 may be disposed over (i.e., bonded to) a bottom surface of the second electroactive layer 2120. The primary electrode 2132, the secondary electrode 2134, and the tertiary electrode 2136 may be electrically connected to a respective voltage source 2101, 2103, 2105. In some embodiments, secondary electrode 2134 may be connected to electrical ground.

The bimorph actuator may overlie a layer of lens fluid 2160, which may overlie a transparent support 2170, and a sealing membrane 2180. Together with the bimorph architecture and the support 2170, sealing membrane 2180 may be configured to contain the lens fluid 2060. In some embodiments, the layer of lens fluid 2160 may be omitted.

According to some embodiments, one or both of the electroactive layers 2110, 2120 may include regions of disparate piezoelectric response, which may be generated by spatially localized poling. According to some embodiments, the electroactive layers 2110, 2120 may be compositionally equivalent or compositionally distinct. By way of example, one of the electroactive layers 2110, 2120 may include a piezoelectric material while the other of the electroactive layers 2120, 2110 may include an electrostrictive material. In an actuated state, liquid lens 2100 may exhibit compound curvature.

Figure 22:
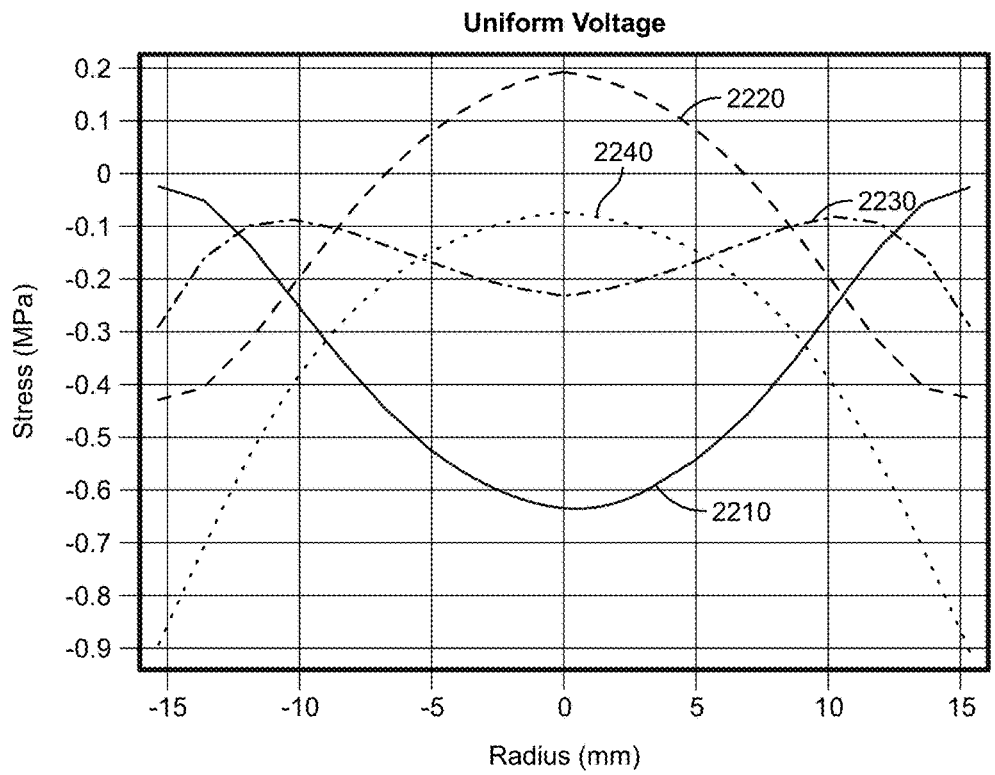
FIG. 22 is a plot showing radial and hoop stresses along a vertical direction of the lens shown in FIG. 3 in response to a uniform applied voltage according to certain embodiments.
Figure 23:
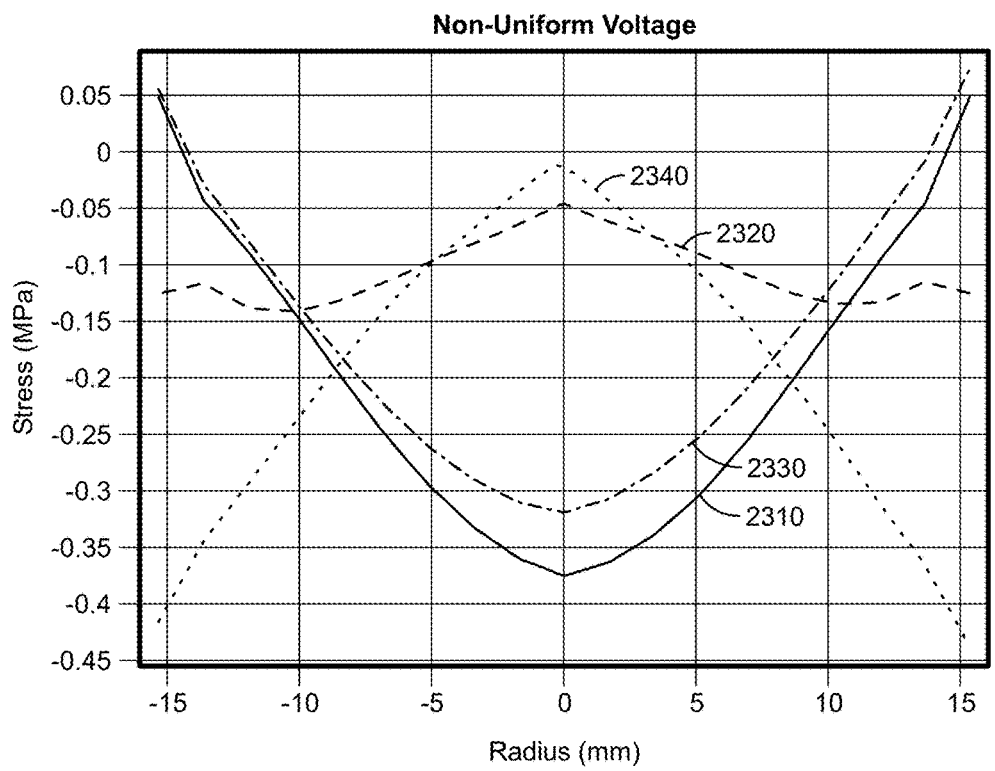
FIG. 23 is a plot showing radial and hoop stresses along a vertical direction of the lens shown in FIG. 3 in response to a non-uniform applied voltage according to certain embodiments.
Figure 24:
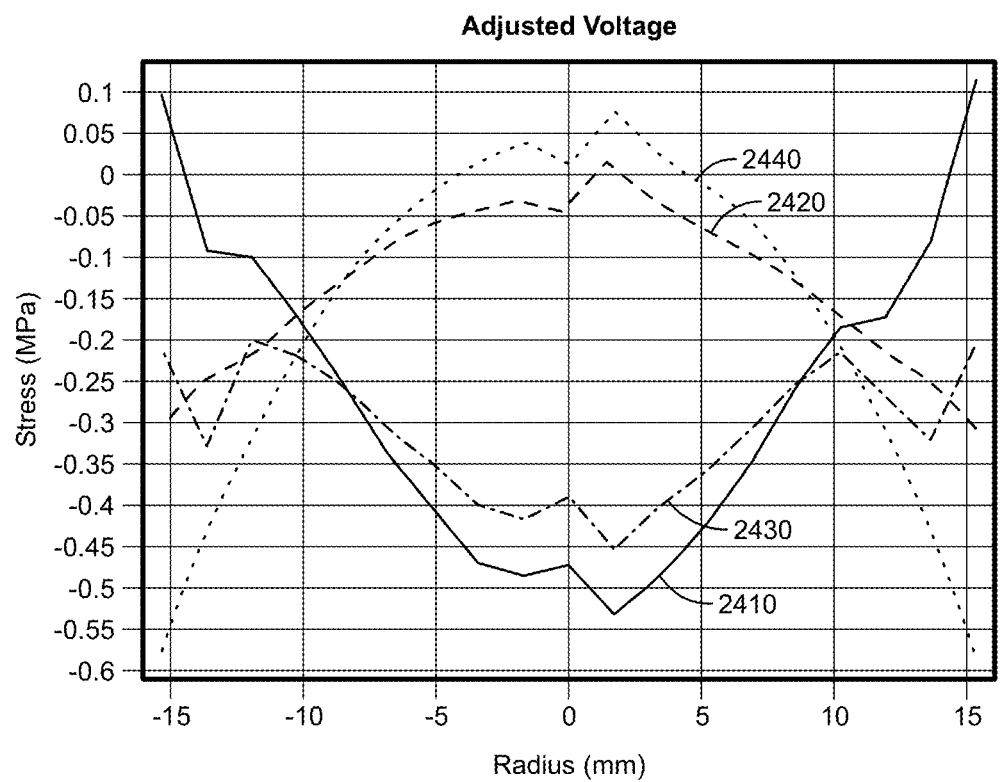
FIG. 24 is a plot showing radial and hoop stresses along a vertical direction of the lens shown in FIG. 3 associated with enhanced optical power in response to an adjusted non-uniform applied voltage according to certain embodiments.

The effects of an applied voltage on an active liquid lens are shown in FIGS. 22-24. The data in FIGS. 22-24 include plots of stress versus position along a vertical direction in response to a uniform voltage, a non-uniform voltage, and an adjusted non-uniform voltage, respectively. The selected voltage in each case leads to an average optical power of 1.0 diopter. In each example, and with reference also to FIG. 3B, the actuated liquid lens may be characterized by a compound curvature having a convex upper surface and a concave lower surface.

Referring initially to FIG. 22, the data in response to a uniform voltage include a plot of radial stress at the upper surface of the lens 2210, radial stress at the lower surface of the lens 2220, hoop stress at the upper surface of the lens 2230, and hoop stress at the lower surface of the lens 2240. In particular, the stress state may include a substantial compressive hoop stress along a periphery of the lens lower surface (curve 2240). In the present example, the compressive hoop stress along the lower surface of the lens along its periphery exceeds approximately 0.5 MPa. In some embodiments, in response to a uniform actuation voltage, the maximum realized hoop stress in the lens may exceed approximately 0.5 MPa, approximately 0.6 MPa, approximately 0.7 MPa, or even approximately 0.8 MPa, which may cause buckling of the lens.

Turning to FIG. 23, the data in response to a non-uniform voltage include a plot of radial stress at the upper surface of the lens 2310, radial stress at the lower surface of the lens 2320, hoop stress at the upper surface of the lens 2330, and hoop stress at the lower surface of the lens 2340. Notably, for a non-uniform actuation voltage, the compressive hoop stress at the lower surface of the lens (curve 2340) may be substantially less than for a uniform actuation voltage, which results in a significant decrease in the tendency for the lens to buckle. In the present example, the compressive hoop stress along the lower surface of the lens along its periphery is less than approximately 0.5 MPa, e.g., less than approximately 0.45 MPa. In some embodiments, in response to a non-uniform actuation voltage, the maximum realized hoop stress in the lens may be less than approximately 0.5 MPa, or less than approximately 0.45 MPa.

Referring to FIG. 24, the data in response to an adjusted non-uniform voltage include a plot of radial stress at the upper surface of the lens 2410, radial stress at the lower surface of the lens 2420, hoop stress at the upper surface of the lens 2430, and hoop stress at the lower surface of the lens 2440. It will be appreciated that the maximum hoop stress at the lower surface of the lens for the adjusted non-uniform voltage (curve 2440) may be less than the maximum hoop stress at the lower surface of the lens for the uniform voltage (curve 2240), which results in a significant decrease in the tendency for the lens to buckle while creating more uniform optical properties throughout the lens.

Figure 25:
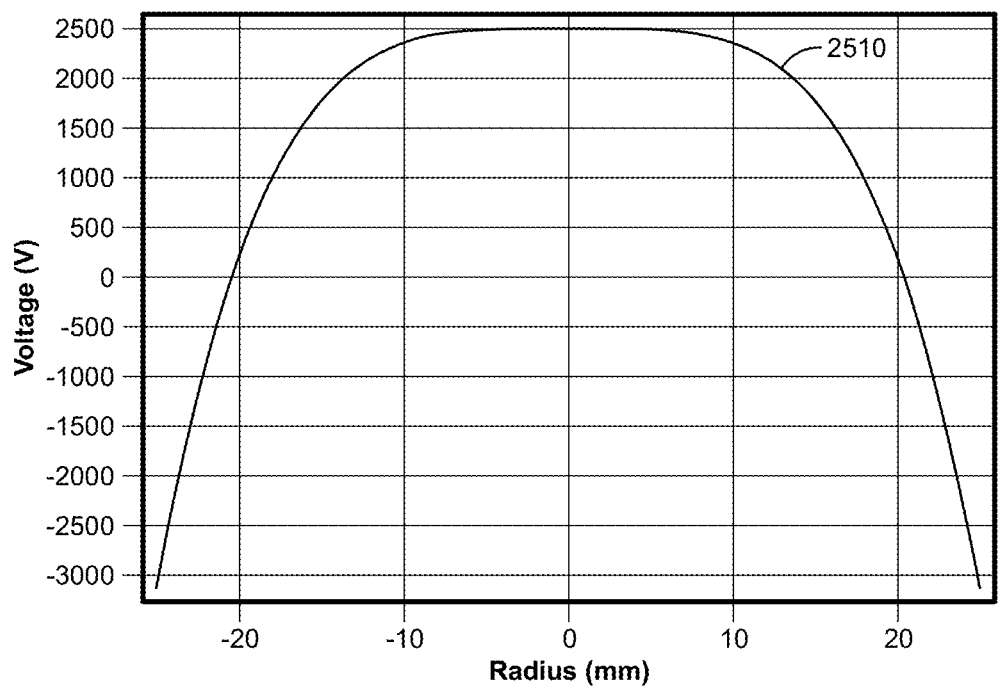
FIG. 25 shows the profile of a radially varying voltage applied to a unimorph electroactive actuator integrated with a liquid lens according to some embodiments.
Figure 26:
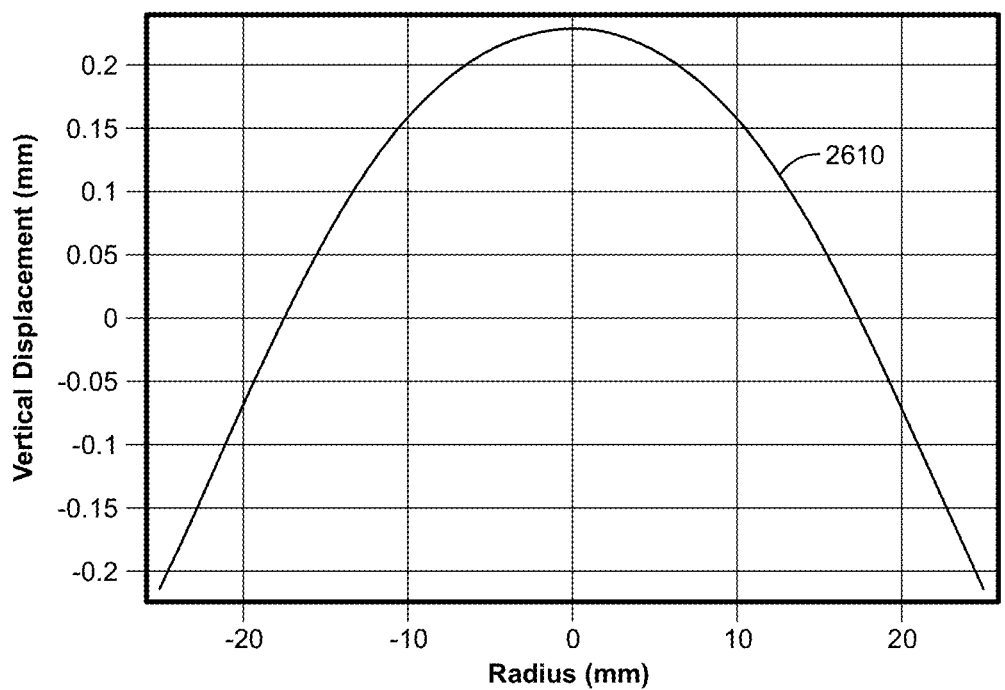
FIG. 26 is a plot showing the vertical displacement associated with the voltage profile of FIG. 25 according to some embodiments.
Figure 27:
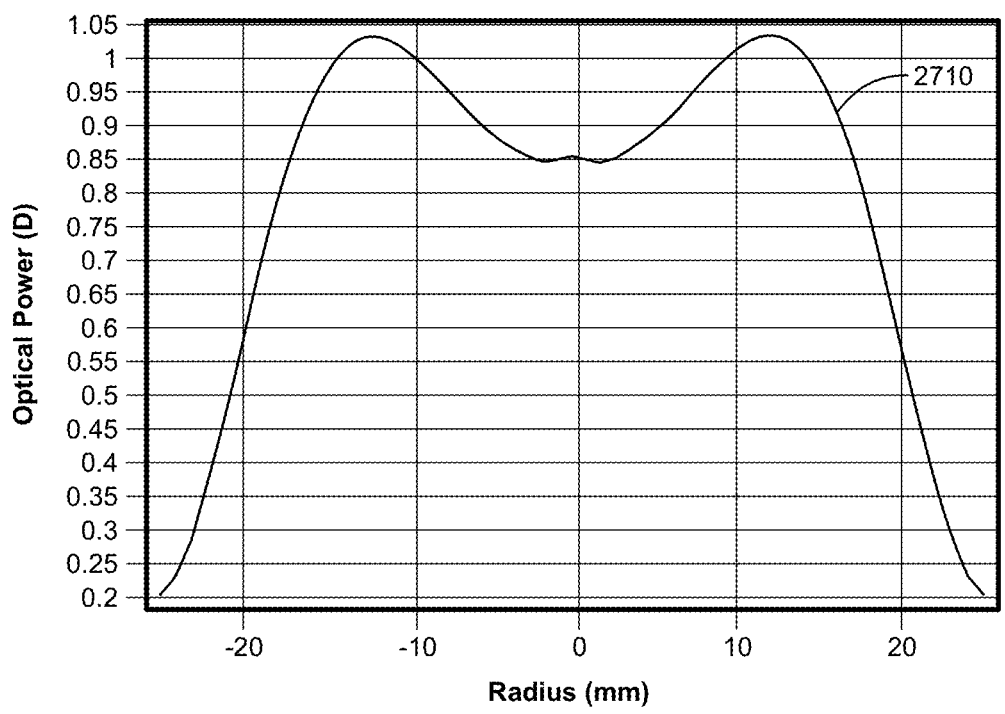
FIG. 27 shows the optical power associated with the voltage profile of FIG. 25 according to certain embodiments.

According to a further embodiment, and with reference to FIGS. 25-27, an approximately 50 millimeter diameter circular liquid lens may be integrated with a PVDF-based unimorph actuator. The liquid lens may include a lens fluid having a refractive index of approximately 1.67. The electroactive PVDF layer may be biaxially symmetric (i.e., $d31 \approx d32$). Compound curvature, as well as controllable optical power and cylindricity, may be introduced into the lens without buckling by applying a spatially varying voltage that causes the central portion of the lens to expand and the peripheral portion of the lens to contract.

Referring to FIG. 25, shown is a plot of an example radially-varying (non-uniform) voltage 2510 applied to the active liquid lens described above. Corresponding plots of vertical displacement 2610 along a radius of the lens and the resulting optical power 2710 are shown in FIGS. 26 and 27.

As disclosed herein, an actuator is characterized by a spatially variable response function, which may be used to induce a customized stress-strain profile in a device that is integrated with the actuator. When incorporated into a liquid lens, for example, the actuator may be used to tailor the curvature of the lens and may be used to induce a wide range of diopter curvature without causing mechanical buckling of the lens. In certain embodiments, the actuator may create compound curvature, such as aspherical contours, and may be used to form a profile that includes spherical and cylindrical components.

In certain applications, the actuator, which may be configured as a unimorph architecture or a bimorph architecture, may include a pair of electrodes and a layer of an electroactive material disposed between the electrodes. The electroactive (e.g., piezoelectric or electrostrictive) material may include a polymer or ceramic composition, and the electrodes may include any suitable conductive material(s), such as transparent conductive oxides (e.g., TCOs such as ITO), graphene, etc.

The spatially variable response may be generated using segmented (patterned) electrodes, where the magnitude of an actuation bias may be locally applied to the electroactive layer. In further embodiments, poling of the electroactive material may include the localized application of one or more of temperature and electric field for a specified period of time to create an electroactive layer having a spatially variable response to a uniformly applied actuation bias. The actuators may be used in a wide range of applications, including ophthalmic lenses, accommodation lenses, variable and Zernike combiners, despeckle filters, and to provide flat-field correction. Further example actuators may be incorporated into a variety of mechanical devices, including MEMS devices, fluid pumps, cooling systems, energy harvesting systems, haptic feedback systems, accelerometers, microphones, speakers, flow sensors, level sensors, pressure sensors, acoustic and vibration damping systems, ultrasound and sonar generation systems, ultrasonic imaging, micropumps, valves, nebulizers, inkjet devices, and medical implants.

EXAMPLE EMBODIMENTS

Example 1: An actuator includes a primary electrode, a secondary electrode overlapping at least a portion of the primary electrode, and an electroactive layer disposed between and abutting the primary electrode and the secondary electrode, wherein a mechanical deformation of the electroactive layer is locally controllable over an area of the actuator.

Example 2: The actuator of Example 1, where the mechanical deformation of the electroactive layer is configured to generate compound curvature.

Example 3: The actuator of any of Examples 1 and 2, where the primary electrode includes a plurality of mutually isolated electrically conductive segments.

Example 4: The actuator of Example 3, where each electrode segment of the plurality of electrode segments is electrically connected to a respective voltage source.

Example 5: The actuator of any of Examples 3 and 4, where at least a portion of the electrode segments are arranged radially over the area of the actuator.

Example 6: The actuator of any of Examples 3-5, where at least a portion of the electrode segments are arranged in a circumferential array over the area of the actuator.

Example 7: The actuator of any of Examples 3-6, where the secondary electrode includes a plurality of mutually isolated electrically conductive segments.

Example 8: The actuator of any of Examples 3-7, where the electroactive layer includes a piezoelectric material.

Example 9: The actuator of Example 8, where a piezoelectric coefficient of the piezoelectric material varies as a function of position over the area of the actuator.

Example 10: The actuator of any of Examples 8 and 9, where transverse piezoelectric coefficients of the piezoelectric material are substantially equal.

Example 11: The actuator of any of Examples 1-10, further including a transparent support disposed over the secondary electrode opposite the electroactive layer.

Example 12: The actuator of any of Examples 1-11, further including an antireflective coating overlapping at least a portion of the primary electrode opposite the electroactive layer.

Example 13: A head-mounted display including the actuator of any Examples 1-12.

Example 14: A method includes applying a voltage to an actuator, the actuator including a primary electrode, a secondary electrode overlapping at least a portion of the primary electrode, and an electroactive layer disposed between and abutting the primary electrode and the secondary electrode, where the voltage applied to the primary electrode induces mechanical deformation of the actuator and a compound curvature in the electroactive layer.

Example 15: The method of Example 14, where the primary electrode includes a plurality of mutually isolated electrically conductive segments and a different voltage is applied to at least two of the segments.

Example 16: The method of any of Examples 14 and 15, where the electroactive layer includes a piezoelectric material having a piezoelectric coefficient that varies as a function of position within the electroactive layer, and a spatially and temporally uniform voltage is applied to the primary electrode.

Example 17: The method of any of Examples 14-16, further including forming a dielectric layer between the primary electrode and the electroactive layer.

Example 18: The method of any of Examples 14-17, where the mechanical deformation includes a radial expansion within a central region of the electroactive layer and a radial contraction within an annular region of the electroactive layer located peripheral to the central region.

Example 19: An actuator includes a primary electrode, a secondary electrode overlapping at least a portion of the primary electrode, a tertiary electrode overlapping at least a portion of the secondary electrode, a first electroactive layer disposed between and abutting the primary electrode and the secondary electrode, and a second electroactive layer disposed between and abutting the secondary electrode and the tertiary electrode, wherein a mechanical deformation of the electroactive layers is locally controllable over an area of the actuator and the mechanical deformation is configured to generate compound curvature.

Example 20: The actuator of Example 19, where the first electroactive layer includes a piezoelectric material and the second electroactive layer includes an electrostrictive material.

Example 21: A method includes heating a layer of a piezoelectric material to a temperature greater than its Curie temperature, applying a spatially varying voltage across the layer of piezoelectric material, and cooling the layer of piezoelectric material while maintaining the spatially varying voltage.

Example 22: The method of Example 21, where the layer of piezoelectric material is heated uniformly.

Example 23: The method of any of Examples 21 and 22, further including forming a primary electrode over a surface of the layer of piezoelectric material, where the primary electrode includes a plurality of mutually isolated electrically conductive segments.

Example 24: A method includes locally heating regions of a layer of piezoelectric material to a temperature greater than its Curie temperature, applying a voltage across the layer of piezoelectric material, and cooling the heated regions of the layer of piezoelectric material while maintaining the applied voltage.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (such as, e.g., augmented-reality system 2800 in FIG. 28) or that visually immerses a user in an artificial reality (such as, e.g., virtual-reality system 2900 in FIG. 29). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 28:
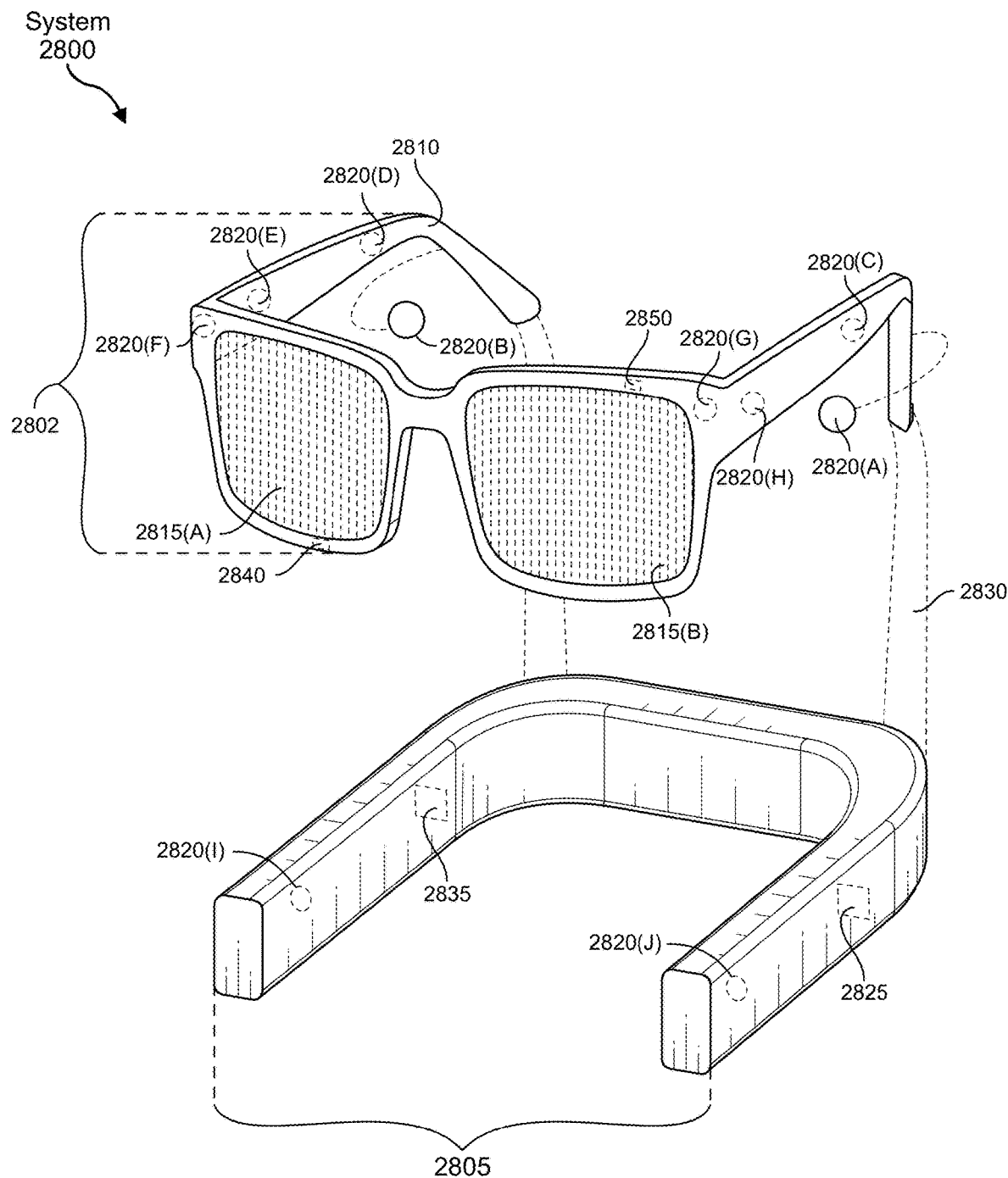
FIG. 28 is an illustration of exemplary augmented-reality glasses that may be used in connection with embodiments of this disclosure.
Figure 29:
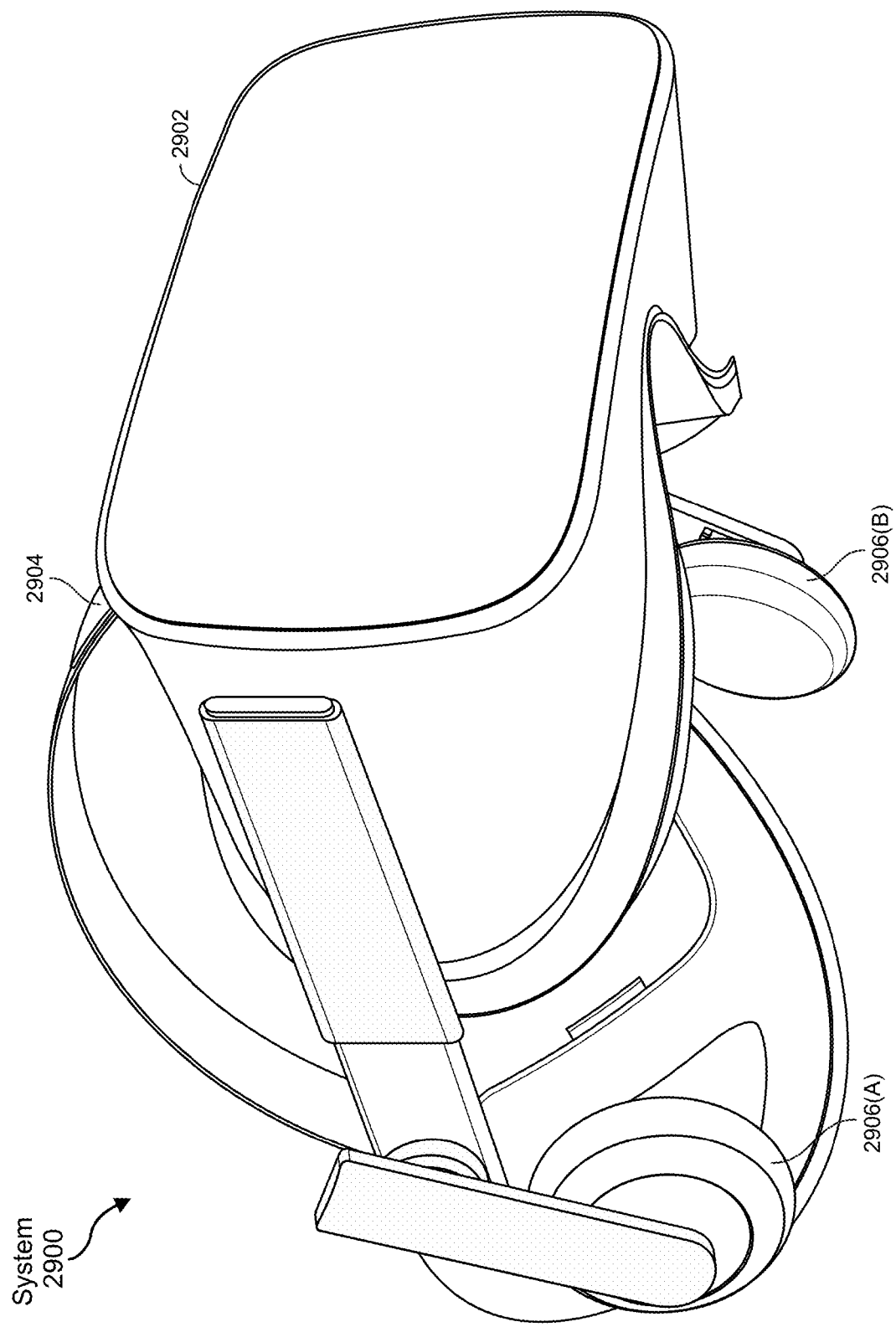
FIG. 29 is an illustration of an exemplary virtual-reality headset that may be used in connection with embodiments of this disclosure.

Turning to FIG. 28, augmented-reality system 2800 may include an eyewear device 2802 with a frame 2810 configured to hold a left display device 2815(A) and a right display device 2815(B) in front of a user's eyes. Display devices 2815(A) and 2815(B) may act together or independently to present an image or series of images to a user. While augmented-reality system 2800 includes two displays, embodiments of this disclosure may be implemented in augmented-reality systems with a single NED or more than two NEDs.

In some embodiments, augmented-reality system 2800 may include one or more sensors, such as sensor 2840. Sensor 2840 may generate measurement signals in response to motion of augmented-reality system 2800 and may be located on substantially any portion of frame 2810. Sensor 2840 may represent one or more of a variety of different sensing mechanisms, such as a position sensor, an inertial measurement unit (IMU), a depth camera assembly, a structured light emitter and/or detector, or any combination thereof. In some embodiments, augmented-reality system 2800 may or may not include sensor 2840 or may include more than one sensor. In embodiments in which sensor 2840 includes an IMU, the IMU may generate calibration data based on measurement signals from sensor 2840. Examples of sensor 2840 may include, without limitation, accelerometers, gyroscopes, magnetometers, other suitable types of sensors that detect motion, sensors used for error correction of the IMU, or some combination thereof.

In some examples, augmented-reality system 2800 may also include a microphone array with a plurality of acoustic transducers 2820(A)-2820(J), referred to collectively as acoustic transducers 2820. Acoustic transducers 2820 may represent transducers that detect air pressure variations induced by sound waves. Each acoustic transducer 2820 may be configured to detect sound and convert the detected sound into an electronic format (e.g., an analog or digital format). The microphone array in FIG. 28 may include, for example, ten acoustic transducers: 2820(A) and 2820(B), which may be designed to be placed inside a corresponding ear of the user, acoustic transducers 2820(C), 2820(D), 2820(E), 2820(F), 2820(G), and 2820(H), which may be positioned at various locations on frame 2810, and/or acoustic transducers 2820(I) and 2820(J), which may be positioned on a corresponding neckband 2805.

In some embodiments, one or more of acoustic transducers 2820(A)-(J) may be used as output transducers (e.g., speakers). For example, acoustic transducers 2820(A) and/or 2820(B) may be earbuds or any other suitable type of headphone or speaker.

The configuration of acoustic transducers 2820 of the microphone array may vary. While augmented-reality system 2800 is shown in FIG. 28 as having ten acoustic transducers 2820, the number of acoustic transducers 2820 may be greater or less than ten. In some embodiments, using higher numbers of acoustic transducers 2820 may increase the amount of audio information collected and/or the sensitivity and accuracy of the audio information. In contrast, using a lower number of acoustic transducers 2820 may decrease the computing power required by an associated controller 2850 to process the collected audio information. In addition, the position of each acoustic transducer 2820 of the microphone array may vary. For example, the position of an acoustic transducer 2820 may include a defined position on the user, a defined coordinate on frame 2810, an orientation associated with each acoustic transducer 2820, or some combination thereof.

Acoustic transducers 2820(A) and 2820(B) may be positioned on different parts of the user's ear, such as behind the pinna, behind the tragus, and/or within the auricle or fossa. Or, there may be additional acoustic transducers 2820 on or surrounding the ear in addition to acoustic transducers 2820 inside the ear canal. Having an acoustic transducer 2820 positioned next to an ear canal of a user may enable the microphone array to collect information on how sounds arrive at the ear canal. By positioning at least two of acoustic transducers 2820 on either side of a user's head (e.g., as binaural microphones), augmented-reality device 2800 may simulate binaural hearing and capture a 3D stereo sound field around about a user's head. In some embodiments, acoustic transducers 2820(A) and 2820(B) may be connected to augmented-reality system 2800 via a wired connection 2830, and in other embodiments acoustic transducers 2820(A) and 2820(B) may be connected to augmented-reality system 2800 via a wireless connection (e.g., a Bluetooth connection). In still other embodiments, acoustic transducers 2820(A) and 2820(B) may not be used at all in conjunction with augmented-reality system 2800.

Acoustic transducers 2820 on frame 2810 may be positioned in a variety of different ways, including along the length of the temples, across the bridge, above or below display devices 2815(A) and 2815(B), or some combination thereof. Acoustic transducers 2820 may also be oriented such that the microphone array is able to detect sounds in a wide range of directions surrounding the user wearing the augmented-reality system 2800. In some embodiments, an optimization process may be performed during manufacturing of augmented-reality system 2800 to determine relative positioning of each acoustic transducer 2820 in the microphone array.

In some examples, augmented-reality system 2800 may include or be connected to an external device (e.g., a paired device), such as neckband 2805. Neckband 2805 generally represents any type or form of paired device. Thus, the following discussion of neckband 2805 may also apply to various other paired devices, such as charging cases, smart watches, smart phones, wrist bands, other wearable devices, hand-held controllers, tablet computers, laptop computers, other external compute devices, etc.

As shown, neckband 2805 may be coupled to eyewear device 2802 via one or more connectors. The connectors may be wired or wireless and may include electrical and/or non-electrical (e.g., structural) components. In some cases, eyewear device 2802 and neckband 2805 may operate independently without any wired or wireless connection between them. While FIG. 28 illustrates the components of eyewear device 2802 and neckband 2805 in example locations on eyewear device 2802 and neckband 2805, the components may be located elsewhere and/or distributed differently on eyewear device 2802 and/or neckband 2805. In some embodiments, the components of eyewear device 2802 and neckband 2805 may be located on one or more additional peripheral devices paired with eyewear device 2802, neckband 2805, or some combination thereof.

Pairing external devices, such as neckband 2805, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 2800 may be provided by a paired device or shared between a paired device and an eyewear device, thus reducing the weight, heat profile, and form factor of the eyewear device overall while still retaining desired functionality. For example, neckband 2805 may allow components that would otherwise be included on an eyewear device to be included in neckband 2805 since users may tolerate a heavier weight load on their shoulders than they would tolerate on their heads. Neckband 2805 may also have a larger surface area over which to diffuse and disperse heat to the ambient environment. Thus, neckband 2805 may allow for greater battery and computation capacity than might otherwise have been possible on a stand-alone eyewear device. Since weight carried in neckband 2805 may be less invasive to a user than weight carried in eyewear device 2802, a user may tolerate wearing a lighter eyewear device and carrying or wearing the paired device for greater lengths of time than a user would tolerate wearing a heavy stand-alone eyewear device, thereby enabling users to more fully incorporate artificial-reality environments into their day-to-day activities.

Neckband 2805 may be communicatively coupled with eyewear device 2802 and/or to other devices. These other devices may provide certain functions (e.g., tracking, localizing, depth mapping, processing, storage, etc.) to augmented-reality system 2800. In the embodiment of FIG. 28, neckband 2805 may include two acoustic transducers (e.g., 2820(I) and 2820(J)) that are part of the microphone array (or potentially form their own microphone subarray). Neckband 2805 may also include a controller 2825 and a power source 2835.

Acoustic transducers 2820(I) and 2820(J) of neckband 2805 may be configured to detect sound and convert the detected sound into an electronic format (analog or digital). In the embodiment of FIG. 28, acoustic transducers 2820(I) and 2820(J) may be positioned on neckband 2805, thereby increasing the distance between the neckband acoustic transducers 2820(I) and 2820(J) and other acoustic transducers 2820 positioned on eyewear device 2802. In some cases, increasing the distance between acoustic transducers 2820 of the microphone array may improve the accuracy of beamforming performed via the microphone array. For example, if a sound is detected by acoustic transducers 2820(C) and 2820(D) and the distance between acoustic transducers 2820(C) and 2820(D) is greater than, e.g., the distance between acoustic transducers 2820(D) and 2820(E), the determined source location of the detected sound may be more accurate than if the sound had been detected by acoustic transducers 2820(D) and 2820(E).

Controller 2825 of neckband 2805 may process information generated by the sensors on neckband 2805 and/or augmented-reality system 2800. For example, controller 2825 may process information from the microphone array that describes sounds detected by the microphone array. For each detected sound, controller 2825 may perform a direction-of-arrival (DOA) estimation to estimate a direction from which the detected sound arrived at the microphone array. As the microphone array detects sounds, controller 2825 may populate an audio data set with the information. In embodiments in which augmented-reality system 2800 includes an inertial measurement unit, controller 2825 may compute all inertial and spatial calculations from the IMU located on eyewear device 2802. A connector may convey information between augmented-reality system 2800 and neckband 2805 and between augmented-reality system 2800 and controller 2825. The information may be in the form of optical data, electrical data, wireless data, or any other transmittable data form. Moving the processing of information generated by augmented-reality system 2800 to neckband 2805 may reduce weight and heat in eyewear device 2802, making it more comfortable to the user.

Power source 2835 in neckband 2805 may provide power to eyewear device 2802 and/or to neckband 2805. Power source 2835 may include, without limitation, lithium ion batteries, lithium-polymer batteries, primary lithium batteries, alkaline batteries, or any other form of power storage. In some cases, power source 2835 may be a wired power source. Including power source 2835 on neckband 2805 instead of on eyewear device 2802 may help better distribute the weight and heat generated by power source 2835. The incorporation into some systems of multiple high voltage sources (e.g., as an array of high voltage sources) may decrease the overall power consumption of such systems during use.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 2900 in FIG. 29, that mostly or completely covers a user's field of view. Virtual-reality system 2900 may include a front rigid body 2902 and a band 2904 shaped to fit around a user's head. Virtual-reality system 2900 may also include output audio transducers 2906(A) and 2906(B). Furthermore, while not shown in FIG. 29, front rigid body 2902 may include one or more electronic elements, including one or more electronic displays, one or more inertial measurement units (IMUs), one or more tracking emitters or detectors, and/or any other suitable device or system for creating an artificial-reality experience.

Artificial-reality systems may include a variety of types of visual feedback mechanisms. For example, display devices in augmented-reality system 2800 and/or virtual-reality system 2900 may include one or more liquid crystal displays (LCDs), light emitting diode (LED) displays, organic LED (OLED) displays, digital light project (DLP) micro-displays, liquid crystal on silicon (LCOS) micro-displays, and/or any other suitable type of display screen. These artificial-reality systems may include a single display screen for both eyes or may provide a display screen for each eye, which may allow for additional flexibility for varifocal adjustments or for correcting a user's refractive error. Some of these artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some of the artificial-reality systems described herein may include one or more projection systems. For example, display devices in augmented-reality system 2800 and/or virtual-reality system 2900 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

The artificial-reality systems described herein may also include various types of computer vision components and subsystems. For example, augmented-reality system 2800 and/or virtual-reality system 2900 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

The artificial-reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial-reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

While various features, elements, or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to an electroactive polymer that comprises or includes polyvinylidene fluoride include embodiments where an electroactive polymer consists of polyvinylidene fluoride and embodiments where an electroactive polymer consists essentially of polyvinylidene fluoride.

What is claimed is:

1. An actuator comprising:
   a primary electrode;
   a secondary electrode overlapping at least a portion of the primary electrode; and
   an electroactive layer disposed between and abutting the primary electrode and the secondary electrode, wherein the primary electrode comprises a plurality of mutually isolated electrically conductive and radially partitioned segments and a mechanical deformation of the electroactive layer is locally controllable over an area of the actuator.

2. The actuator of claim 1, wherein the mechanical deformation of the electroactive layer is configured to generate compound curvature.

3. The actuator of claim 1, wherein each electrode segment of the plurality of electrode segments is electrically connected to a respective voltage source.

4. The actuator of claim 1, wherein at least a portion of the electrode segments are arranged radially over the area of the actuator.

5. The actuator of claim 1, wherein at least a portion of the electrode segments are arranged in a circumferential array over the area of the actuator.

6. The actuator of claim 1, wherein the secondary electrode comprises a plurality of mutually isolated electrically conductive segments.

7. The actuator of claim 1, wherein the electroactive layer comprises a piezoelectric material.

8. The actuator of claim 7, wherein a piezoelectric coefficient of the piezoelectric material varies as a function of position over the area of the actuator.

9. The actuator of claim 7, wherein transverse piezoelectric coefficients of the piezoelectric material are substantially equal.

10. The actuator of claim 1, further comprising a transparent support disposed over the secondary electrode opposite the electroactive layer.

11. The actuator of claim 1, further comprising an anti-reflective coating overlapping at least a portion of the primary electrode opposite the electroactive layer.

12. A head-mounted display comprising the actuator of claim 1.

13. A method comprising:
    applying a voltage to an actuator, the actuator comprising:
      a primary electrode;
      a secondary electrode overlapping at least a portion of the primary electrode; and
      an electroactive layer disposed between and abutting the primary electrode and the secondary electrode, wherein the voltage is applied to the primary electrode to induce mechanical deformation of the actuator and a compound curvature in the electroactive layer, the primary electrode comprises a plurality of mutually isolated electrically conductive and radially partitioned segments, and a different voltage is applied to at least two of the segments.

14. The method of claim 13, wherein the electroactive layer comprises a piezoelectric material having a piezoelectric coefficient that varies as a function of position within the electroactive layer, and a spatially and temporally uniform voltage is applied to the primary electrode.

15. The method of claim 13, further comprising forming a dielectric layer between the primary electrode and the electroactive layer.

16. The method of claim 13, wherein the mechanical deformation comprises a radial expansion within a central region of the electroactive layer and a radial contraction within an annular region of the electroactive layer located peripheral to the central region.

* * * * *